United States Patent [19]
Jewell et al.

[11] Patent Number: 5,825,796
[45] Date of Patent: Oct. 20, 1998

[54] EXTENDED WAVELENGTH STRAINED LAYER LASERS HAVING STRAIN COMPENSATED LAYERS

[75] Inventors: Jack L. Jewell, Boulder, Colo.; Henryk Temkin, Ransom Canyon, Tex.

[73] Assignee: Picolight Incorporated, Boulder, Colo.

[21] Appl. No.: 721,589

[22] Filed: Sep. 25, 1996

[51] Int. Cl.⁶ .............. H01S 3/19; H01L 29/06; H01L 33/00; H01L 31/0328

[52] U.S. Cl. ............... 372/45; 372/46; 257/18; 257/94; 257/17; 257/190

[58] Field of Search ............ 372/45, 46; 257/190, 257/18, 17, 94, 192, 194; 117/89; 438/494; 428/426

[56] References Cited

U.S. PATENT DOCUMENTS

| | | | |
|---|---|---|---|
| 4,804,639 | 2/1989 | Yablonovitch | 117/56 |
| 5,019,874 | 5/1991 | Inoue et al. | 257/190 |
| 5,045,894 | 9/1991 | Migita et al. | 257/94 |
| 5,048,036 | 9/1991 | Scifres et al. | 372/45 |
| 5,060,030 | 10/1991 | Hoke | 257/190 |
| 5,075,744 | 12/1991 | Tsui | 257/190 |
| 5,091,767 | 2/1992 | Bean et al. | 257/190 |
| 5,156,995 | 10/1992 | Fitzgerald et al. | 438/494 |
| 5,181,086 | 1/1993 | Yoshida | 257/18 |
| 5,254,496 | 10/1993 | Briggs et al. | 117/89 |
| 5,262,660 | 11/1993 | Streit et al. | 257/194 |
| 5,321,278 | 6/1994 | Nakagawa | 257/192 |
| 5,339,325 | 8/1994 | Kito et al. | 372/45 |
| 5,363,392 | 11/1994 | Kasukawa et al. | 372/45 |
| 5,363,798 | 11/1994 | Yoder | 117/89 |
| 5,367,182 | 11/1994 | Matsugatani et al. | 257/190 |
| 5,373,166 | 12/1994 | Buchan et al. | 257/18 |
| 5,381,434 | 1/1995 | Bhat et al. | 372/45 |
| 5,448,084 | 9/1995 | Hoke et al. | 257/190 |
| 5,459,331 | 10/1995 | Izumi | 257/94 |
| 5,491,710 | 2/1996 | Lo | 372/45 |
| 5,493,577 | 2/1996 | Choquette et al. | 372/46 |

(List continued on next page.)

FOREIGN PATENT DOCUMENTS 07-154023  6/1995  Japan .................. 372/43

OTHER PUBLICATIONS

Coleman, James J., *Quantum Well Lasers*, edited by Peter Zory, London, Academic Press, pp. 372–413, 1993. (No Month Available).

(List continued on next page.)

*Primary Examiner*—John D. Lee
*Assistant Examiner*—Quyen Phan Leung
*Attorney, Agent, or Firm*—Jagtiani & Associates

[57] ABSTRACT

Several methods are used in novel ways with newly identified and viable parameters to decrease the peak transition energies of the pseudomorphic InGaAs/GaAs heterostructures. These techniques, taken separately or in combination, suffice to permit operation of light emitting devices at wavelengths of 1.3 $\mu$m or greater of light-emitting electro-optic devices. These methods or techniques, by example, include: (1) utilizing new superlattice structures having high In concentrations in the active region, (2) utilizing strain compensation to increase the usable layer thickness for quantum wells with appropriately high In concentrations, (3) utilizing appropriately small amounts of nitrogen (N) in the pseudomorphic InGaAsN/GaAs laser structure, and (4) use of nominal (111) oriented substrates to increase the usable layer thickness for quantum wells with appropriately high In concentrations. In all of the above techniques, gain offset may be utilized in VCSELs to detune the emission energy lower than the peak transition energy, by about 25 meV or even more, via appropriate DBR spacing. Gain offset may also be utilized in some forms of in-plane lasers. Increased temperature may also be used to decrease peak transition energy (and therefore the emission energy) by about 50 meV/100° C. All these techniques are furthermore applicable to other material systems, for example, extending the emission wavelength for laser diodes grown on InP substrates. Additionally, structures which utilize the above techniques are discussed.

73 Claims, 6 Drawing Sheets

U.S. PATENT DOCUMENTS

| | | | |
|---|---|---|---|
| 5,512,375 | 4/1996 | Green et al. | 428/426 |
| 5,517,039 | 5/1996 | Holonyak et al. | 257/94 |
| 5,521,935 | 5/1996 | Irikawa | 372/45 |
| 5,548,140 | 8/1996 | Nguyen et al. | 257/194 |
| 5,719,894 | 2/1998 | Jewell et al. | 372/45 |
| 5,719,895 | 2/1998 | Jewell et al. | 372/45 |

OTHER PUBLICATIONS

Omura et al., "Low Threshold Current 1.3µm GaInAsP Lasers Grown on GaAs Substrates," Electronic Letters, vol. 25, No. 25, pp. 1718–1719, Dec. 7, 1989.

Shoji et al., "Fabrication of $In_{0.25}Ga_{0.75}As$/InGaAsP Strained SQW Lasers on $In_{0.05}Ga_{0.95}As$ Ternary Substrate," IEEE Photonic Technology Letters, vol. 6, No. 10, pp. 1170–1172, Oct. 10, 1994.

Fisher et al., "Pulsed Electrical Operation of 1.5 µm Vertical–Cavity Surface Emitting Lasers," IEEE Photonics Technology Letters, vol. 7, No. 6, pp. 608–609, Jun. 6, 1995.

Melman et al., "InGaAs/GaAs Strained Quantum Wells with a 1.3µm Band Edge at Room Temperature," Applied Physics Letters, vol. 55, pp. 1436–1438, Oct. 2, 1989.

Waters et al., "Viable Strained Layer Laser at λ=1100nm, "Journal of Applied Physics, vol, pp. 1132–1134, Jan. 15,1990.

Roan and Chang, "Long–Wavelength (1.3µm) Luminescence in InGaAs Strained Quantum–Well Structures grown on GaAs," Applied Physics Letters, vol. 59, pp. 2688–2690, Nov. 18, 1991.

Margalit et al., "Laterally Oxidized Long Wavelength CW Vertical–Cavity Lasers, " Applied Physics Letters, vol. 69, pp. 471–472, Jul. 22, 1996. No. 4.

Zhang and Ovtchinnikov, Applied Physics Letters, vol. 62, No. 14, pp. 1644–1646, Apr. 5, 1993.

Uchiyama et al., "Low Threshold Room Temperature Continuous Wave Operation of 1.3µm GaInAsP/InP Strained Layer Multiquantum Well Surface Emitting Laser," Electronics Letters, vol. 32, No. 11, pp. 1011–1013, May 23, 1996.

Hasenberg, "Linear Optical Properties of Quantum Wells Composed of All–Binary InAs/GaAs Short–Period Strained– Layer Superlattices," Applied Physics Letters., vol. 58, No. 9, pp. 937–939, Mar. 4, 1991.

Fukunaga et al., "Reliable Operation of Strain–Compensated 1.06µm InGaAs/InGaAsP/GaAs Single Quantum Well Lasers,"Applied Physics Letters., vol. 69, No. 2, pp. 248–250, Jul. 8, 1996.

Kondow et al., "GaInNAs: A Novel Material for Long––Wavelength–Range Laser Diodes with Excellent High–Temperature Performance," Jpn.J.Appl.Phys., vol. 35, pp. 1273–1275, Feb. 1996. Part 1, No. 2B.

Kondow et al., "Gas–Source Molecular Beam Epitaxy of $GaN_x As_{1-x}$ Using a N Radical as the N Source," Jpn. J. Appl. Phys., vol. 33, pp. 1056–1058, Aug. 1, 1996. Part 2, No. 8A.

Dagenais et al., Integrated Optoelectronics, Academic Press, pp. 175–178, 1995. (No Month Available).

Anan et al. in an article entitled "Critical Layer Thickness on (111) B–Oriented InGaAs Heteroepitaxy," Applied Physics Letters, vol. 60, pp. 3159–3161, Jun. 1992 No. 25.

Blum et al., "Wet Thermal Oxidation of AlAsSb Lattice Matched to InP for Optoelectronic Applications," Applied Physics Letters., vol. 68, No. 22, pp. 3129–3131, May 27, 1996.

Mirin, R.P., "1.3µm Photoluminescence From InGaAs quantum dots on GaAs," Applied Physics Letters., vol. 67, No. 25, pp. 3795–3797, Dec. 18, 1995.

Anan et al., "Improved Reflectivity if AlPSb/GaPSb Bragg Reflector for 1.55µm Wavelength," Electronics Letters, vol. 30 No. 25, pp. 2138–2139, Dec. 1994.

Catchmark et al., in an article entitled "High Temperature CW operation of GaAs/AlGaAs High Barrier Gain Offset VCSELs," Electronic Letters, vol. 30 No. 25, pp. 2136–2138 Dec. 8, 1994.

Young et al., in an article entitled "High–Power Temperature–Insensitive Gain–Offset InGaAs/GaAs Vertical–Cavity Surface–Emitting Lasers," IEEE Photonics Technology Letters, pp. 129–132, Feb. 1993, vol. 5 No. 2.

Gourley et al. in an article entitled "Controversy of Critical Layer Thickness for InGaAs/GaAs strained–Layer Epitaxy," Appl. Phys. Lett. 52(5),Feb. 1, 1988, pp. 377–379.

Kaliteevski et al., in an article entitled "Bandgap Anomaly and Appearance of a Monolayer Superlattice in InGaAs Grown by Metal Organic Chemical Vapour Deposition," Semicond. Sci. Technol. 10, pp. 624–626 (1995). No Month Available.

Figure 3
| Properties of Strained InGaAs Quantum Wells on GaAs | | | | | | | | | |
|---|---|---|---|---|---|---|---|---|---|
| y | strain | CT (Å) | x1.5 (Å) | x2.0 (Å) | CAS (Å%) | E(CT) (eV) | λ(CT) (nm) | 1.3μm (Å) | xCT | AS(1.3μm) (Å%) |
| 0.33 | 0.023641 | 71.9 | 108 | 144 | 170 | 1.118 | 1109 | | | |
| 0.40 | 0.028656 | 55.3 | 83.0 | 111 | 158 | 1.080 | 1148 | | | |
| 0.50 | 0.035820 | 40.4 | 60.6 | 80.8 | 145 | 1.042 | 1190 | 80.0 | 1.98 | 287 |
| 0.60 | 0.042984 | 31.0 | 46.5 | 62.0 | 133 | 1.026 | 1210 | 44.0 | 1.42 | 189 |
| 0.67 | 0.047999 | 26.2 | 39.3 | 52.4 | 126 | 1.019 | 1217 | 34.0 | 1.30 | 164 |
| 0.75 | 0.053730 | 22.0 | 33.0 | 44.0 | 118 | 1.018 | 1218 | 28.0 | 1.27 | 150 |
| 0.80 | 0.057312 | 19.8 | 29.7 | 39.6 | 114 | 1.021 | 1214 | 24.5 | 1.24 | 141 |
| 1.00 | 0.071640 | 13.6 | 20.4 | 27.2 | 97.4 | 1.050 | 1181 | 17.5 | 1.29 | 126 |
Figure 4a
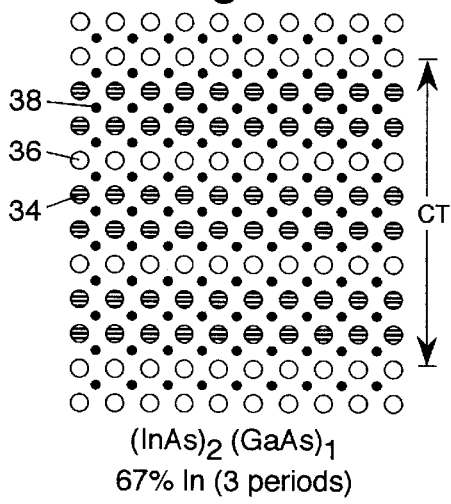
$(InAs)_2 (GaAs)_1$
67% In (3 periods)
Figure 4b
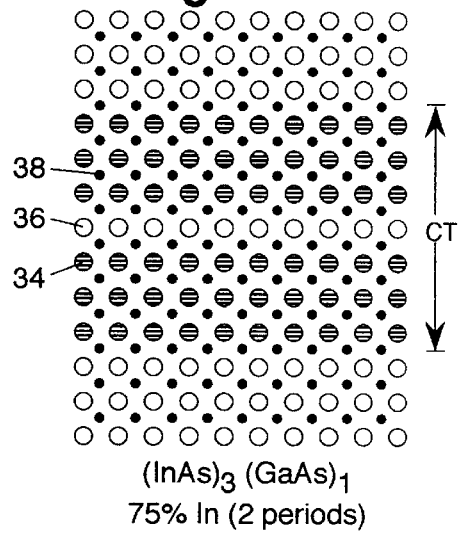
$(InAs)_3 (GaAs)_1$
75% In (2 periods)
Figure 4c
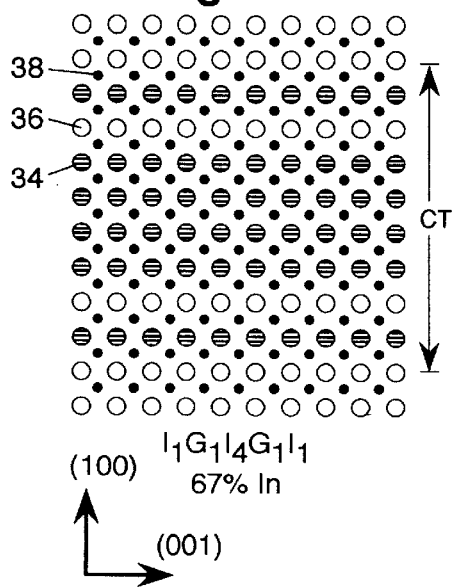
$I_1G_1I_4G_1I_1$
67% In
Figure 4d
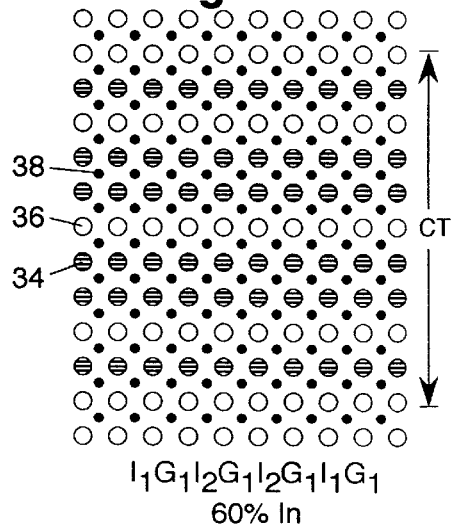
$I_1G_1I_2G_1I_2G_1I_1G_1$
60% In

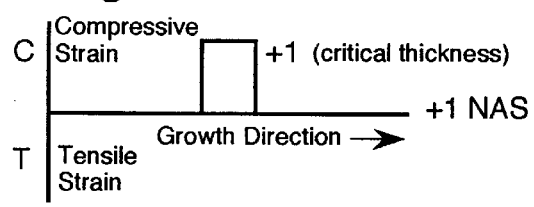
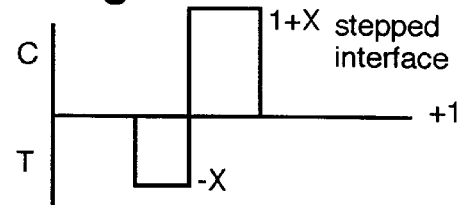
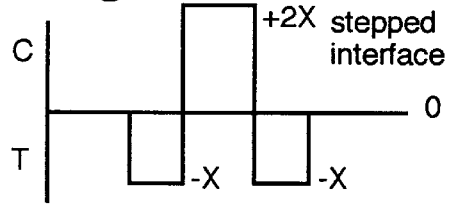
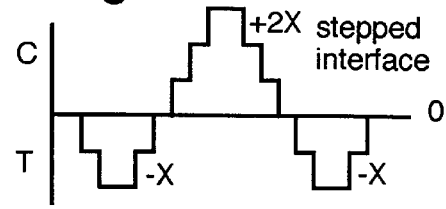
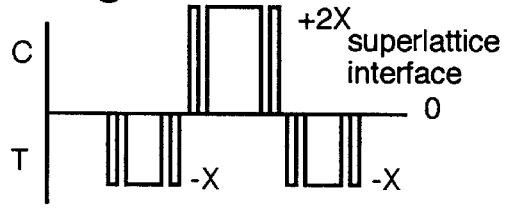
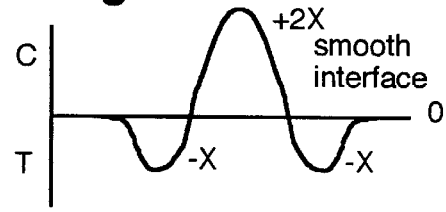
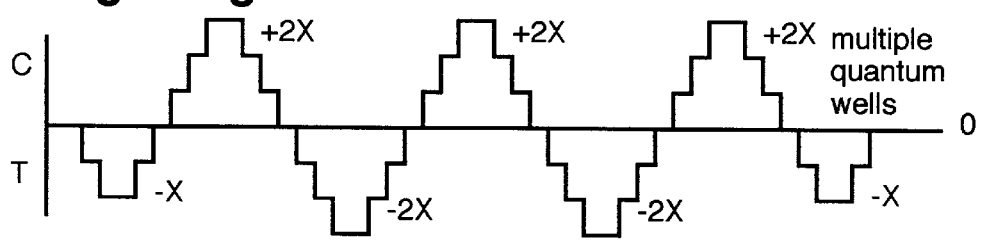
Figure 6
| Strained GaAsP on GaAs | | | |
|---|---|---|---|
| z | strain | CT (Å) | CAS (Å%) |
| 0.10 | 0.0036 | 758 | 273 |
| 0.20 | 0.0072 | 328 | 236 |
| 0.30 | 0.0108 | 199 | 215 |
| 0.40 | 0.0144 | 138 | 199 |
| 0.50 | 0.0180 | 103 | 185 |
| 0.60 | 0.0216 | 81 | 175 |
| 0.70 | 0.0252 | 66 | 166 |
| 0.80 | 0.0288 | 55 | 158 |
| 0.90 | 0.0324 | 47 | 152 |
| 1.00 | 0.0360 | 40 | 144 |

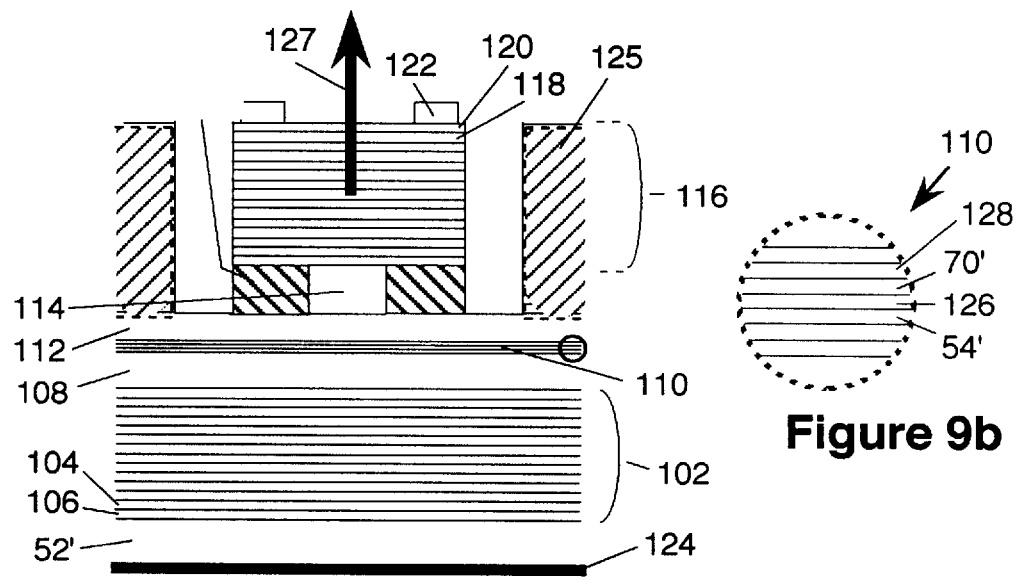
Figure 9a
Figure 9b
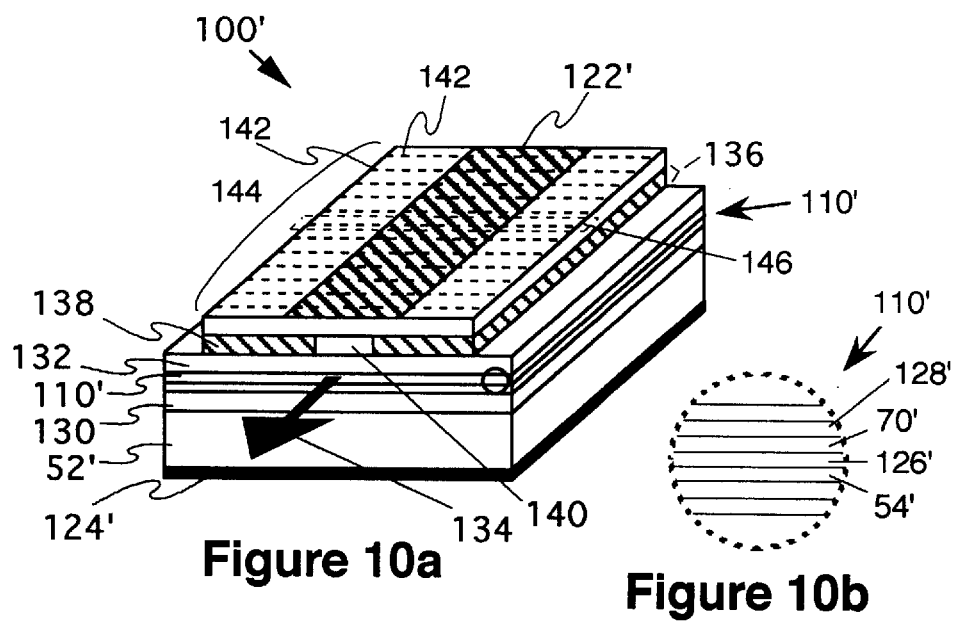
Figure 10a
Figure 10b

EXTENDED WAVELENGTH STRAINED LAYER LASERS HAVING STRAIN COMPENSATED LAYERS

CROSS-REFERENCE TO RELATED APPLICATIONS

This application makes reference to the following co-pending U.S. patent applications. The first application is U.S. Pat. No. 5,719,891, entitled "Conductive Element with Lateral Oxidation Barrier," filed Dec. 18, 1995. The second application is U.S. Pat. No. 5,729,566, entitled "Light Emitting Device Having an Electrical Contact Through a Layer containing Oxidized Material," filed Jun. 7, 1996. The third application is U.S. application. Ser. No. 08/686,489 entitled "Lens Comprising at Least One Oxidized Layer and Method for Forming Same," filed Jul. 25, 1996. The fourth application is U.S. Pat. No. 5,724,374 entitled "Aperture comprising an Oxidized Region and a Semiconductor Material," filed Aug. 19, 1996. These applications are hereby incorporated by reference.

BACKGROUND OF THE INVENTION

1. Field of the Invention

The present invention relates generally to semiconductor light sources such as LEDs and VCSELs, and more particularly to a strained layer semiconductor laser having an emission wavelength of at least 1.3 $\mu$m.

2. Description of the Prior Art

Vertical-Cavity Surface-Emitting Lasers (VCSELs), Edge Emitting Lasers (EELs) or Light Emitting Diodes (LEDs) are becoming increasingly important for a wide variety of applications including optical interconnection of integrated circuits, optical computing systems, optical recording and readout systems, and telecommunications. Vertically emitting devices have many advantages over edge-emitting devices, including the possibility for wafer scale fabrication and testing, and the possibility of forming two-dimensional arrays of the vertically emitting devices. The circular nature of the light output beams from these devices also make them ideally suited for coupling into optical fibers as in optical interconnects or other optical systems for integrated circuits and other applications.

For high-speed optical fiber communications, laser or LED emission wavelengths in the 1.3 $\mu$m through 1.55 $\mu$m region are desired. Standard silica fiber has zero dispersion near 1.3 $\mu$m and has a minimum loss near 1.55 $\mu$m. The need for semiconductor lasers emitting in this wavelength region has spawned worldwide development of such lasers. Group III–V semiconductors which emit light in the 1.3 through 1.55 $\mu$m region have lattice constants which are more closely matched to InP than to other binary III–V semiconductor substrates, for example, GaAs. Thus, essentially all commercial emitting lasers emitting at 1.3 through 1.55 $\mu$m are grown on InP substrates. These lasers are edge-emitting lasers which, unlike VCSELs, do not require high-reflectivity Distributed Bragg Reflectors (DBRs) to form their optical cavities.

Unfortunately, it has proven difficult to produce effective DBRs on InP substrates. The available materials which lattice match InP have produced mirrors which are extremely thick and lossy and have thus not resulted in efficient VCSELs.

VCSELs or Surface Emitting Lasers SELs whose current flow is controlled by lateral oxidation processes have show the best performances of any VCSELs in terms of low threshold current, high efficiency, and high speed. All such "oxide VCSELs" have been fabricated using AlAs or AlGaAs layers which were grown on GaAs substrates and later oxidized. Thus, one would want to utilize a VCSEL structure such as is disclosed in U.S. Pat. No. 5,493,577, by Choquette et al. This VCSEL has the advantages of: (1) reduced mode hopping; (2) being temperature stable, and (3) testable in a modified silicon wafer tester. Unfortunately, this VCSEL structure will have an emission wavelength between 600 and 1,000 nm and thus falls short of the desired 1.3 $\mu$m emission wavelength. Due to the availability of well-behaved oxidizable materials which may be grown on GaAs substrates and the straightforward capability of producing efficient high-reflectivity DBRs on GaAs substrates, when manufacturing VCSELs it is highly desirable to grow them on GaAs substrates.

The salient components of a VCSEL typically include two DBRs, and between them, a spacer which contains an active region having a length emitting material. The DBRs and active region form an optical cavity characterized by a cavity resonance at a resonant wavelength corresponding to a resonant photon energy. It has become a practice in the operation of VCSELs to detune the optical cavity to energies at about 25 meV lower than the peak transition energy by appropriate DBR spacing. Such "gain offset" is used to advantage in reducing temperature sensitivity. This produces an emission wavelength which is appreciably longer than the peak transition wavelength. This practice, while inadequate in itself for increasing emission wavelength to 1.3 $\mu$m from material grown pseudomorphically on GaAs substrates, does measurably increase emission wavelength. Even if this technique was incorporated with the teachings of the prior art, one would fall short of the desired 1.3 $\mu$m emission wavelength.

While epitaxial growth of slightly-lattice-mismatched materials is undertaken routinely, materials which emit in the 1.3 $\mu$m through 1.55 $\mu$m region have lattice constants sufficiently removed from that of GaAs to make pseudomorphic epitaxial growth problematic. In this context, "pseudomorphic" means having a sufficiently low density of misfit dislocations such that lasers may be produced which have reasonably long lifetimes. The problems have been sufficiently great to cause researchers to abandon such efforts and resort to less desirable hybrid approaches to producing 1.3 $\mu$m through 1.55 $\mu$m VCSELs.

Thus, the production of VCSELs emitting at 1.3 through 1.55 $\mu$m wavelengths has been inhibited by either of two problems. The problems result from the fact that VCSELs require laser-quality active materials and high-refletivity DBR mirrors. These two problems are:

(1) when InP substrates are used, growth of the light emitting active material is straightforward, but production of efficient DBRs is difficult and has not been effective; and (2) when GaAs substrates are used, DBR production is straightforward, but efforts to grow laser-quality active material have been unsuccessful.

The following is a summary of the prior approaches which are relevant to the problem of producing 1.3 though 1.55 $\mu$m VCSELs.

A 1.3 $\mu$m edge-emitting laser grown on a GaAs substrate was reported by Omura et al., in an article entitled "Low Threshold Current 1.3 $\mu$m GaInAsP Lasers Grown on GaAs Substrates," Electronics Letters, vol. 25, pp. 1718–1719, Dec. 7, 1989. The structure comprises a layer having a high density of misfit dislocations, on top of which were grown thick layers of materials having lattice constants close to that of InP. Such lasers exhibit very poor reliability due to the misfit dislocations. Furthermore, this structure does not readily lend itself to integration with DBR mirrors.

The use of a layer having high-density misfit dislocations was also reported by Melman et al., in an article entitled "InGaAs/GaAs Strained Quantum Wells with a 1.3 µm Band Edge at Room Temperature," Applied Physics Letters, vol. 55, pp. 1436–1438, Oct. 2, 1989. The article states that pseudomorphic, i.e., nearly misfit dislocation free, growth of 1.3 µm emitting material is not possible with GaAs barriers, i.e., GaAs substrates. This conclusion prompted the approach to incorporate a layer having a high density of misfit dislocations.

A 1.1 µm emitting laser is reported in Waters et al., in an article entitled "Viable Strained Layer Laser at λ=1100 nm," Journal of Applied Physics, vol. 67, pp. 1132–1134, Jan. 15, 1990. The laser utilized a single quantum well comprising $In_{0.45}Ga_{0.55}As$ strained semiconductor material which has a greater thickness than its predicted critical thickness. Reliability tests are presented for 4000 hours of testing. To our knowledge, these are the longest-wavelength lasers produced on GaAs substrates which have survived such testing. In this article, even Waters recognizes the difficulty of creating a reliable device having an active region over the respective CT for the semiconductor material in the active region.

A strained quantum well emitting at 1.3 µm is reported by Roan and Chang in an article entitled "Long-Wavelength (1.3 µm) Luminescence in InGaAs Strained Quantum-Well Structures grown on GaAs," Applied Physics Letters, vol. 59, pp. 2688–2690, Nov. 18, 1991. The quantum well was a short-period superlattice comprising alternating monolayers of InAs and GaAs. However, the quantum well had a thickness well above (1.78 times) the critical thickness, above which high densities of misfit dislocations exist. Thus, the structure is not viable for long-lived lasers and no lasers were produced from such a structure.

A compromise between GaAs and InP substrates is reported by Sahoji et al., in an article entitled "Fabrication of $In_{0.25}Ga_{0.75}As/InGaAsP$ Strained SQW Lasers on $In_{0.05}Ga_{0.95}As$ Ternary Substrate," IEEE Photonic Technology Letters, vol. 6, no. 10, pp. 1170–1172, Oct. 10, 1994. An $In_{0.05}Ga_{0.95}As$ ternary substrate was utilized which has a lattice constant intermediate between those of GaAs and InP. The In concentration of the substrate was 5% of the group III material (2.5% of the total material) and the laser emitted at 1.3 µm. The authors indicate that 1.3 µm lasers will require an InGaAs substrate having about 25% or more In for the group-III material. Ternary substrates are unlikely to approach the availability, size and price of binary substrates such as GaAs.

James Coleman, in his book entitled "Quantum Well Lasers," edited by Peter Zory, London, Academic Press, pp. 372–413, 1993, discusses the concept of critical thickness in strained layers lasers which utilize $In_yGa_{1-y}As$. As may be seen in FIG. 4 of this reference, as the composition of In increases, i.e., y approaches 0.5, the critical thickness drops dramatically. Turning now to FIG. 10 of this reference, it may be seen that Coleman has demonstrated that as the In concentration increases, the peak transition wavelength increases in a sub-linear fashion. As the In concentration approaches 0.5 the peak transition wavelength approaches about 1.20 µm. If one was to extrapolate information from this graph for In concentrations greater than or equal to 0.5, one would come to the clear conclusion that a peak transition wavelength of 1.3 µm is not obtainable while maintaining the $In_yGa_{1-y}As$ layer within the critical thickness. Thus, while Coleman does provide a valuable teaching, he is unable to reach a 1.3 µm peak transition wavelength.

The issue of strain compensation to increase the number of strained quantum wells which may be grown without misfit dislocations is frequently used in the art and is described by Zhang and Ovtchinnikov in an article entitled "Strain-compensated InGaAs/GaAsP/GaInAsP/GaInP Quantum Well Lasers (λ~0.98 µm) Grown by Gas-Source Molecular Beam Epitaxy," Applied Physics Letters, vol. 62, pp. 1644–1646, 1993. The reader is also referred to U.S. Pat. No. 5,381,434 by Bhat and Zah.

The advantages of incorporating strain into the active region of a semiconductor laser were described by Yablonovitch in U.S. Pat. No. 4,804,639. Yablonovitch discloses active regions of $In_yGa_{1-y}As$ grown on GaAs substrates, typically with y~0.5, and having a thickness preferably less than 100 Å. He suggests the possibility of "the addition of counter-strain layers of GaP on either side of the active strained layer," but does not pursue this possibility. He goes on to perform numerical evaluations based on "an assumed set of numerical coefficients which are thought to be representative of a quaternary semiconductor with a band edge near the 1.5 µm wavelength." The material is further assumed to have a strain of 3.7% and a thickness of 100 Å which was thought to be "probably the maximum permissible thickness for such a high strain." This strain for y=0.5 is calculated to be less than ~40 Å. Thus, although a >1.3 µm emitting laser utilizing strained InGaAs on GaAs is indirectly suggested, no actual structure is specified and the parameters are not realistic.

In U.S. Pat. No. 5,060,030, Hoke describes improvements in electron mobility and electron saturation for use in high-electron-mobility transistors (HEMTs). He describes the use of strain compensation to increase the thickness or In concentration "by approximately a factor of two" in a strained InGaAs layer grown on GaAs.

A strain-compensated heterostructure laser diode is described by Buchan et al. in U.S. Pat. No. 5,373,166. Buchan describes graded structures in the compressive and tensile strained quaternary layers with the strain magnitudes less than 1%. The thicknesses of the layers described are less than their conventional critical thicknesses.

Vawter et al., in an article entitled "Useful Design Relationships for the Engineering of Thermodynamically Stable Strained-layer Structures," Journal of Applied Physics, vol. 65, pp. 4769–4773, 1989, describes approaches for engineering dislocation-free strained-layer structures. The article includes a methodology for calculating the "critical thickness" of structures comprising layers of differing lattice constants. The methodology is based upon a "reduced effective strain" which is the sum of the strain-thickness products of all the layers divided by the total thickness of the layers Based upon this "reduced effective strain," the "critical thickness" for the structures is then calculated from a critical thickness criterion, e.g., that introduced by Matthews and Blakeslee.

Asahi et al., in an article entitled "New III–V Compound Semiconductors TlInGaP . . . " Japanese Journal of Applied Physics, describes the inclusion of the group-III element thallium (Tl) in III–V semiconductors for long-wavelength emission. Most of the discussion focuses on lasers emitting at wavelengths greater than 2 µm on InP substrates, but it is stated that TlGaP lattice-matched to GaAs substrate has a bandgap emission of about 1.24 µm. The extreme toxicity and hazardous nature of Tl, even after epitaxial growth is performed, makes it undesirable as a manufacturing material.

Very recently, it has been shown that adding nitrogen to InGaAs, actually decreases the peak transition energy and thereby increases the peak transition wavelength as described by Kondow et al., in an article entitled "GaInNAs: A Novel Material for Long-Wavelength-Range Laser Diodes with Excellent High-Temperature Performance," Jpn. J. Appl. Phys., vol. 35, pp. 1273–1275, February 1996. The report suggests that it is difficult to grow high quality InGaAsN with very much N. A room temperature photoluminescence spectrum of a 70 Å thick $In_yGa_{1-y}As_{1-v}N_v$/GaAs quantum well showed significant broadening even with only less than 1% N concentration for the group V semiconductor element. This corresponds to a value of v being less than 0.01. The peak transition wavelength of this semiconductor was 1.23 μm. In the report, the authors state that their plan is to reach a 1.3 μm device by increasing the N concentration to 1% while maintaining a 30% In concentration.

A hybrid approach to address the dual problem described earlier has been reported by Margalit et al., in an article entitled "Laterally Oxidized Long Wavelength CW Vertical-Cavity Lasers," Applied Physics Letters, vol. 69, pp. 471–472, Jul. 22, 1996. In this work, two DBRs are grown on two separate GaAs substrates, while the active material is grown on a third substrate which comprises InP. The active material comprises seven compressively strained InGaAsP quantum wells clad by 300 nm of InP on each side. To assemble these materials, two processes are performed, each including the thermal fusion of two wafers and removal of one substrate. Then the resulting structure is processed by standard VCSEL processing methods.

Since VCSELs are presently the subject of intense research and development, a great deal of results and advancements are published periodically. The following is a list of documents which are relevant to the problem of extending emission wavelengths of semiconductor lasers or of producing 1.3 μm through 1.55 μm VCSELs.

Fisher et al., "Pulsed Electrical Operation of 1.5 μm Vertical-Cavity Surface Emitting Lasers," IEEE Photonics Technology Letters, Vol. 7, No. 6, pp. 608–609, Jun. 6, 1995.

Uchiyama et al., "Low Threshold Room Temperature Continuous Wave Operation of 1.3 μm GaInAsP/InP Strained Layer Multiquantum Well Surface Emitting Laser," Electronics Letters, vol. 32, no. 11, pp. 1011–1013, May 23, 1996.

Hasenberg, "Linear Optical Properties of Quantum Wells Composed of All-Binary InAs/GaAs Short-Period Strained-Layer Superlattices," Applied Physics Letters., vol. 58, no. 9, pp. 937–939, Mar. 4, 1991.

Fukunaga et al., "Reliable Operation of Strain-Compensated 1.06 μm InGaAs/InGaAsP/GaAs Single Quantum Well Lasers," Applied Physics Letters., vol. 69, no. 2, pp. 248–250, Jul. 8, 1996.

Kondow et al., "Gas-Source Molecular Beam Epitaxy of $GaN_x As_{1-x}$ Using a N Radical as the N Source," Jpn. J. Appl. Phys., vol. 33, pp. 1056–1058, Aug. 1, 1994.

Shimomura et al., "Improved Reflectivity of AlPSb/GaPSb Bragg Reflector for 1.55 μm Wavelength," Electronics Letters, vol. 30, no. 25, pp. 2138–2139, Dec. 8, 1994.

Blum et al., "Wet Thermal Oxidation of AlAsSb Lattice Matched to InP for Optoelectronic Applications," Applied Physics Letters., vol. 68, no. 22, pp. 3129–3131, May 27, 1996.

Mirin, R. P., "1.3 μm Photoluminescence From InGaAs quantum dots on GaAs," Applied Physics Letters., vol. 67, no. 25, pp. 3795–3797, Dec. 18, 1995.

Thus, although the prior art therefore describes a variety of techniques useful in forming long-wavelength lasers on GaAs substrates, it fails to provide any specific example of a viable such structure, nor does it provide any range of parameters within which viable such structures may be fabricated, nor does it teach the construction of a viable such structure. Some references suggest the possibility of 1.3 μm lasers on GaAs substrates, but provide unrealistic parameters and are several years old or more.

SUMMARY OF THE INVENTION

It is therefore an object of the present invention to provide an active region having a quantum well structure which may be utilized in lasers grown on GaAs substrates and which will provide an emission wavelength of at least 1.3 μm. Extensive work on novel strained InGaAs/GaAs heterostructures have led to an unexpected conclusion which contradicts the conclusions reached in the prior art. It has been found that use of high-indium-content structures permits emission wavelengths of at least 1.3 μm using active layers grown on GaAs substrates which do not exceed their critical thickness. Other techniques allow pseudomorphic growth of active layers above their nominal critical thickness. These techniques, carefully applied to newly-identified parameter spaces, allow the unexpected result of pseudomorphic structures grown on GaAs substrates which emit at 1.3 μm and longer wavelengths. Parameter spaces are defined for viable structures grown on GaAs substrates and emitting at 1.3 μm or longer. Specific examples of these viable structures are provided in the detailed description, below.

Several methods are used in novel ways with newly identified and viable parameters to decrease the peak transition energies of the pseudomorphic InGaAs/GaAs heterostructures. These techniques, taken separately or in combination, suffice to permit operation at wavelengths of 1.3 μm or greater of light-emitting electro-optic devices. These methods or techniques, by example, include: (1) utilizing new superlattice structures having high In concentrations in the active region, (2) utilizing strain compensation to increase the usable layer thickness for quantum wells with appropriately high In concentrations, (3) utilizing appropriately small amounts of nitrogen (N) in the pseudomorphic InGaAsN/GaAs laser structure, and (4) use of nominal (111) oriented substrates to increase the usable layer thickness for quantum wells with appropriately high In concentrations. In all of the above techniques, gain offset may be utilized in VCSELs to detune the emission energy lower than the peak transition energy, by about 25 meV or even more, via appropriate DBR spacing. Gain offset may also be utilized in some forms of in-plane lasers. Increased temperature may also be used to decrease peak transition energy (and therefore the emission energy) by about 50 meV/100° C. All these techniques are furthermore applicable to other material systems, for example, extending the emission wavelength for laser diodes grown on InP substrates.

It is a further object to provide a laser having a long life and being easily manufacturable.

It is yet another object to provide various techniques which may be utilized in combination with high In concentrations to reduce the peak transition energy of a device, having a GaAs substrate, to allow for an emission wavelength of 1.3 μm or greater.

It is yet another object to provide a pseudomorphic superlattice structure on a GaAs substrate which reduces the peak transition energy sufficiently to allow for an emission wavelength of 1.3 μm or greater.

According to one broad aspect of the present invention, there is provided a light emitting device having at least a substrate and an active region, the light emitting device comprising: the substrate having a substrate lattice constant between 5.63 Å and 5.67 Å; the active region comprising at least one pseudomorphic light emitting active layer disposed above the substrate, the active layer comprising at least In, Ga, As and N, the active layer having a thickness equal to or less than a respective CT, where:

$$CT=(0.4374/f)[\ln(CT/4)+1],$$

where f is an average lattice mismatch of the active layer normalized to a lattice constant of 5.65 Å; the active layer having an average sum of In and Sb concentrations in the active layer at 16.5% or greater of a semiconductor material in the active layer and the nitrogen content less than 1% of a group V semiconductor material in the active region; and wherein the light emitting device has an emission wavelength of at least 1.3 μm.

According to another broad aspect of the invention, there is provided a light emitting device having at least a substrate and an active region, the light emitting device comprising: the substrate comprising having a substrate lattice constant between 5.63 Å and 5.67 Å; the active region comprising at least one pseudomorphic light emitting active layer disposed above the substrate, the active layer comprising at least In, Ga and As, the active layer having a thickness equal to or less than 1.25 times a respective CT, where:

$$CT=(0.4374/f)[\ln(CT/4)+1],$$

where f is an average lattice mismatch of the active layer normalized to a lattice constant of 5.65 Å; wherein the active layer comprises at least two strained layers, and a third layer disposed between the two strained layers, forming a superlattice where an average sum of In and Sb concentrations in the superlattice is 25% or greater of a semiconductor material in the active layer; and wherein the light emitting device has an emission wavelength of at least 1.3 μm.

According to another broad aspect of the invention, there is provided a light emitting device having at least a substrate and an active region, the light emitting device comprising: the substrate comprising having a substrate lattice constant between 5.63 Å and 5.67 Å; the active region comprising at least one pseudomorphic light emitting active layer disposed above the substrate, the active layer comprising at least In, Ga and As, the active layer having a thickness equal to or less than 1.25 times a respective CT, where:

$$CT=(0.4374/f)[\ln(CT/4)+1],$$

where f is an average lattice mismatch of the active layer normalized to a lattice constant of 5.65 Å; wherein the active layer comprises; at least two strained layers, and a third layer disposed between the two strained layers, forming a superlattice where an average sum of In and Sb concentrations in the superlattice is greater than 25% of a semiconductor material in the active layer; a first conductive layer having a first conductivity type, the first conductive layer disposed in electrical communication with the active layer; a second conductive layer having a second conductivity type, the second conductive layer being disposed above the active layer and in electrical communication therewith; and electrical communication means for providing electrical current to the active layer; and wherein the light emitting device has an emission wavelength of at least 1.3 μm.

According to another broad aspect of the invention, there is provided a light emitting device having at least a substrate and an active region, the light emitting device comprising: the substrate having a substrate lattice constant between 5.63 Å and 5.67 Å; a first strained layer having a lattice constant smaller than the substrate lattice constant and being disposed between the substrate and the active region; the active region comprising at least one pseudomorphic light emitting active layer disposed above the substrate, the active layer comprising at least In, Ga and As, the active layer comprises at least two strained layers, and a third layer disposed between the two strained layers, the active layer having a thickness equal to or less than 80 Å; and wherein the light emitting device has an emission wavelength of at least 1.3 μm.

According to another broad aspect of the invention, there is provided a light emitting device having at least a substrate and an active region, the light emitting device comprising: the substrate having a substrate lattice constant between 5.63 Å and 5.67 Å; a first strained layer having a lattice constant smaller than a substrate lattice constant and being disposed between the substrate and the active region; the active region comprising at least one pseudomorphic light emitting active layer disposed above the substrate, the active layer comprising at least In, Ga and As; the active layer having a concentration of In and Sb of 25% or greater of a semiconductor material in the active layer, the active layer having a thickness greater than CT and less than 2.5 times CT for a given material, where:

$$CT=(0.4374/f)[\ln(CT/4)+1],$$

where f is an average lattice mismatch of the active layer normalized to a lattice constant of 5.65 Å; wherein the light emitting device has an emission wavelength of at least 1.3 μm.

According to another broad aspect of the invention, there is provided a light emitting device having at least a substrate and an active region, the light emitting device comprising: the substrate comprising having a substrate lattice constant between 5.63 Å and 5.67 Å; the active region comprising at least one pseudomorphic light emitting active layer disposed above the substrate, the active layer comprising at least In, Ga, As and N, the active layer having a thickness equal to or less than a respective CT, where:

$$CT=(0.4374/f)[\ln(CT/4)+1],$$

where f is an average lattice mismatch of the active layer normalized to a lattice constant of 5.65 Å; wherein the active layer comprises at least two strained layers, and a third layer disposed between the two strained layers, forming a superlattice having a nitrogen content of at least 0.01% of a group V semiconductor material in the active region; and wherein the light emitting device has an emission wavelength of at least 1.3 μm.

According to another broad aspect of the invention, there is provided a light emitting device having at least a substrate and an active region, the light emitting device comprising: the substrate comprising having a substrate lattice constant between 5.63 Å and 5.67 Å; a first strained layer disposed between the substrate and the active region, the first strained layer having a first accumulated strain and a first critical accumulated strain associated therewith, the first accumulated strain being less than the first critical accumulated strain; the active region comprising at least one pseudomorphic light emitting active layer disposed above the substrate, the active layer comprising at least In, Ga, As and N, the active layer comprising at least two strained layers, and a third layer disposed between the two strained layers, forming a superlattice having a nitrogen content of at least 0.01% of a group V semiconductor material in the active region, the active layer having a second accumulated strain and a second critical accumulated strain associated therewith, the algebraic sum of the first and second accumulated strains being less than the second critical accumulated strain; wherein the first and second critical accumulated strain for a given material equal a strain of the material multiplied by CT for a given material, where:

$$CT=(0.4374/f)[\ln (CT/4)+1],$$

where f is an average lattice mismatch of the material normalized to a lattice constant of 5.65 Å; and wherein the light emitting device has an emission wavelength of at least 1.3 μm.

According to another broad aspect of the invention, there is provided a light emitting device having at least a substrate and an active region, the light emitting device comprising: the substrate comprising having a substrate lattice constant between 5.63 Å and 5.67 Å; a first strained layer having a lattice constant smaller than aid substrate lattice constant and being disposed between the substrate and the active region; the active region comprising at least one pseudomorphic light emitting active layer disposed above the substrate, the active layer comprising at least In, Ga, As and N, the active layer comprises at least two strained layers, and a third layer disposed between the two strained layers, the active layer having a nitrogen concentration of at least 0.01% of a group V semiconductor material in the active layer, the active layer having a thickness equal to or less than 175 Å; and wherein the light emitting device has an emission wavelength of at least 1.3 μm.

According to another broad aspect of the invention, there is provided a light emitting device having at least a substrate and an active region, the light emitting device comprising: the substrate comprising having a substrate lattice constant between 5.63 Å and 5.67 Å; the substrate comprising having a substrate lattice constant between 5.63 Å and 5.67 Å; a first strained layer having a lattice constant smaller than aid substrate lattice constant and being disposed between the substrate and the active region; the active region comprising at least one pseudomorphic light emitting active layer disposed above the substrate, the active layer comprising at least In, Ga, As and N, the active layer comprises at least two strained layers, and a third layer disposed between the two strained layers, the active layer having a nitrogen concentration of at least 0.01% of a group V semiconductor material in the active layer, the active layer having a thickness equal to or greater than CT for a given material, where:

$$CT=(0.4374/f)[\ln (CT/4)+1],$$

where f is an average lattice mismatch of the active layer normalized to a lattice constant of 5.65 Å; and wherein the light emitting device has an emission wavelength of at least 1.3 μm.

According to another broad aspect of the invention, there is provided a light emitting device having at least a substrate and an active region, the light emitting device comprising: the substrate comprising having a substrate lattice constant between 5.63 Å and 5.67 Å; a first strained layer disposed between the substrate and the active region, the first strained layer having a first accumulated strain and a first critical accumulated strain associated therewith, the first accumulated strain being less than the first critical accumulated strain; the active region comprising at least one pseudomorphic light emitting active layer disposed above the substrate, the active layer comprising at least In, Ga, As and N, the active layer comprises at least two strained layers, and a third layer disposed between the two strained layers, the active layer having an average sum of In and Sb concentrations in the superlattice at 33% or greater and the nitrogen content of at least 0.01% of a group V semiconductor material in the active region, the active layer having a second accumulated strain and a second critical accumulated strain associated therewith, the algebraic sum of the first and second accumulated strain being less than the second critical accumulated strain; wherein the first and second critical accumulated strain for a given material equals a strain of the material multiplied by CT for a given material, where:

$$CT=(0.4374/f)[\ln (CT/4)+1],$$

where f is an average lattice mismatch of the active layer normalized to a lattice constant of 5.65 Å; and wherein the light emitting device has an emission wavelength of at least 1.3 μm.

According to another broad aspect of the invention, there is provided a light emitting device having at least a substrate and an active region, the light emitting device comprising: the substrate comprising having a substrate lattice constant between 5.63 Å and 5.67 Å; a first strained layer having a lattice constant smaller than the substrate lattice constant and being disposed between the substrate and the active region; the active region comprising at least one pseudomorphic light emitting active layer disposed above the substrate, the active layer comprising at least In, and Ga, the active layer comprising at least two strained layers, and a third layer disposed between the two strained layers, the active layer having a second accumulated strain and a second critical accumulated strain associated therewith, the algebraic sum of the first and second accumulated strains being less than the second critical accumulated strain; and wherein the light emitting device has an emission wavelength of at least 1.3 μm.

According to another broad aspect of the invention, there is provided a light emitting device having at least a substrate and an active region, the light emitting device comprising: the substrate comprising having a substrate lattice constant between 5.63 Å and 5.67 Å; a first strained layer disposed between the substrate and the active region, the first strained layer having a first accumulated strain and a first critical accumulated strain associated therewith, the first accumulated strain being less than the first critical accumulated strain; the active region comprising at least one pseudomorphic light emitting active layer disposed above the substrate, the active layer comprising at least In, Ga and As, the active layer comprises at least two strained layers, and a third layer disposed between the two strained layers, forming a superlattice having an average sum of In and Sb concentrations in the superlattice at 25% or greater of a semiconductor material in the active layer, the active layer having a second accumulated strain and a second critical accumulated strain associated therewith, the second accumulated strain being less than the second critical accumulated strain; wherein the first and second critical accumulated strain for a given material equals a strain of the material multiplied by CT for a given material, where:

$$CT=(0.4374/f)[\ln (CT/4)+1],$$

where f is an average lattice mismatch of the active layer normalized to a lattice constant of 5.65 Å; and wherein the light emitting device has an emission wavelength of at least 1.3 μm.

According to another broad aspect of the invention, there is provided a light emitting device having at least a substrate and an active region, the light emitting device comprising: the substrate comprising having a substrate lattice constant between 5.63 Å and 5.67 Å and having a growth plane which has an orientation within 15° of (111); the active region comprising at least one pseudomorphic light emitting active layer disposed above the substrate, the active layer comprising at least In, Ga and As, the active layer having a thickness equal to or less than twice a respective CT, where:

$$CT=(0.4374/f)[\ln (CT/4)+1],$$

where f is an average lattice mismatch of the active layer normalized to a lattice constant of 5.65 Å; wherein the active layer has an average sum of In and Sb concentrations of equal to or greater than 25% or greater of a semiconductor material in the active layer; and wherein the light emitting device has an emission wavelength of at least 1.3 µm.

Other objects and features of the present invention will be apparent from the following detailed description of the preferred embodiment.

BRIEF DESCRIPTION OF THE DRAWINGS

The invention will be described in conjunction with the accompanying drawings, in which:

FIG. 3 is a table which tabulates the properties of In concentration, strain, calculated critical thickness (CT), peak transition energy at CT, peak transition wavelength at CT, and other properties of the strained InGaAs structure illustrates in FIG. 1;

FIGS. 4a through 4d illustrate four examples of superlattice structures which may be utilized in conjunction with the InGaAs material of FIG. 1;

FIGS. 5a through 5g illustrate different design strategies for utilizing compressive and tensile strain to grow pseudomorphic strictures beyond the CT;

FIG. 6 is a table which tabulates the strain, CT and the critical accumulated strain for GaAsP on GaAs where the concentration of P varies;

FIG. 9a is cross section of a VCSEL which incorporates the quantum wells of FIGS. 1, 2a, 7 and/or 8;

FIG. 9b is an exploded view of the active region of FIG. 9a;

FIG. 10a is a cross section of an in-plane emitter which incorporates the quantum wells of FIGS. 1, 2a, 7 and/or 8;

FIG. 10b is an exploded view of the active region of FIG. 10a; and

DETAILED DESCRIPTION OF THE PREFERRED EMBODIMENT

Figure 1:
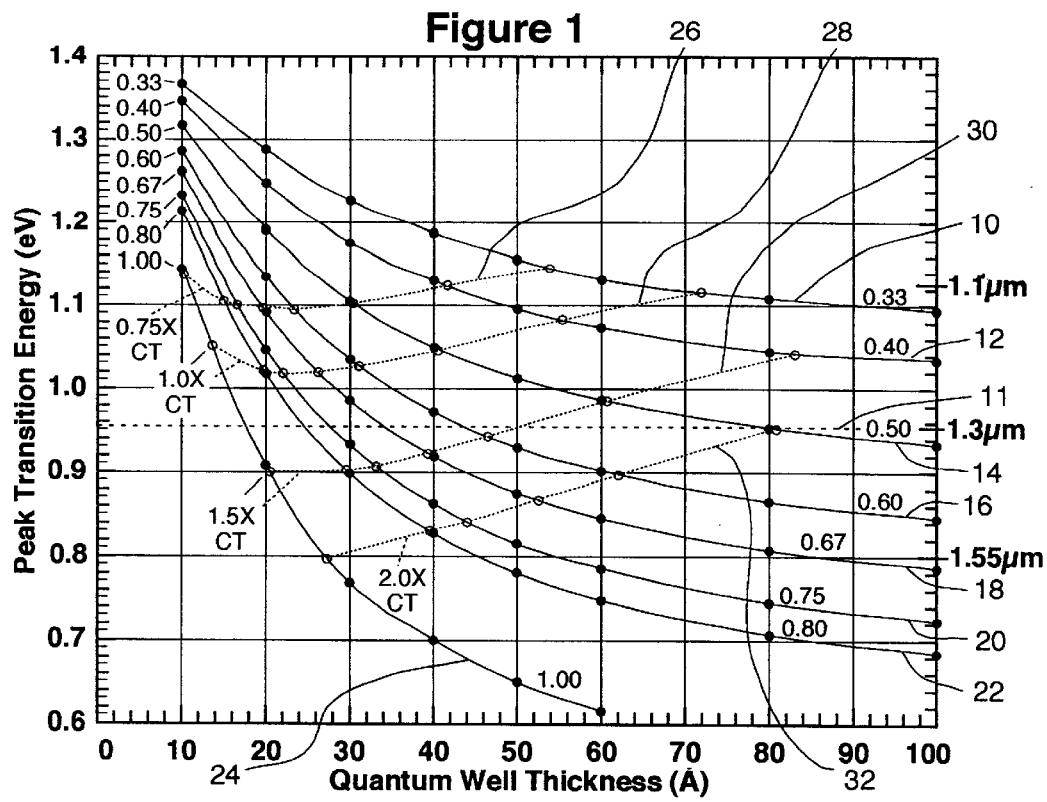
FIG. 1 is a graph of Peak Transition Energy v. Quantum Well Thickness, at 300 K, for several In concentrations of InGaAs strained quantum wells on a GaAs substrate with GaAs barriers constructed in accordance with a preferred embodiment of the invention.

It is advantageous to define several terms before describing the invention. It should be appreciated that the following definitions are used throughout this application.

The term "GaAs" refers to a semiconductor composition which may be used as a substrate. Nominally, the prototypical III–V binary semiconductor material consisting of equal parts of the two elements Ga and As are used to form the semiconductor material. It should be appreciated that some deviations, to meet device needs or unwanted impurities, may be permitted which continue to use established GaAs fabrication procedures. To permit for anticipated need for impurities or other relatively insignificant modifications, it is prescribed that both Ga and As are present and combine to form an amount of at least 95% of the substrate's entire composition. GaAs has a lattice constant of about 5.65 Å. An $In_{0.5}Ga_{0.5}As$ semiconductor has a lattice constant differing from that of GaAs by 0.36% In this application, any substrate having a lattice constant which is within 0.36% of that of GaAs, i.e., between 5.63 Å and 5.67 Å, is viewed as being within the scope of the invention. Additionally, it should be appreciated that the term "substrate" may include any material underneath the active layer. For example, mirror layers, waveguide layers cladding layers or any other layer which is more than twice as thick as the active layer.

The term "InGaAs" refers to a semiconductor material comprising at least In, Ga, and As.

The term "superlattice" refers to a structure having an average composition but with non-uniform layering, and is usually described in terms of atomic monolayer compositions. For example, $In_{0.75}Ga_{0.25}As$ could be a homogeneous alloy having the indicated compositions, or it could be in the form of a superlattice. One superlattice form may be a periodic structure with each period comprising three monolayers of InAs and one monolayer of GaAs. Alternatively, each period may comprise two monolayers of InAs and two monolayers of $In_{0.5}Ga_{0.5}As$. The discerning feature of a superlattice is that the composition be interhomogeneous with respect to atomic layers on a fine scale. Herein, "superlattice" is understood to be a structure grown on a thick substrate and comprising at least two adjacent atomic monolayers which differ in at least one constituent element by at least 15%. We further point out that the literature uses the term "superlattice" in several contexts, which may lead to confusion. For example, in FIG. 4 in the chapter by Coleman, "superlattice" is used in the context of a structure with alternating layers but not having a thick substrate to set the required lattice constant of grown material. Thus, curve (a) in his FIG. 4 is labeled "superlattice" and has a critical thickness twice that of a "quantum well." In the context of this application, such a structure would be considered to have been grown without a thick substrate and is not part of the present invention. On the other hand, Gourley et al., reports an increase in critical thickness by more than 25% of superlattices compared to InGaAs alloys. The superlattices of Gourley et al., are consistent with the use of the term "superlattice" herein. Thus, it is contemplated that a superlattice may allow a 25% increase in critical thickness over the critical thickness for a homogeneous alloy.

The term "Critical Thickness" or CT, discussed in greater detail below, is generally referred to as the critical thickness based on the criteria developed by Matthews and Blakeslee. For a detailed discussion of Critical Thickness, the reader is referred to the article entitled "Defects in Epitaxial Multilayers: I Misfit Dislocations," published in the Journal of Crystal Growth, vol. 27, pp. 118–125 (1974) or the previously referenced book by Coleman. For materials epitaxially grown on (100) oriented GaAs and in the absence of strain compensation, the value of critical thickness may be determined by the following formula:

$$CT = (0.4374/f)[\ln(CT/4) + 1] \qquad (1)$$

where f is the lattice mismatch normalized to the GaAs lattice constant, or more commonly referred to as strain. The strain may be determined by the portion of In or other elements present in the InGaAs semiconductor material. For example, for $In_yGa_{1-y}As$ on GaAs, f equals 0.07164 multiplied by y, where y varies between 0.0 and 1.0. Generally, the CT is measured in Å and varies between 71.9 Å and 13.6 Å for $In_yGa_{1-y}As$ where y varies between 0.33 and 1.0.

For a strained $In_yGa_{1-y}As$ semiconductor material on a InP substrate, the equivalent expression is:

$$CT = (0.454/f)[\ln(CT/4.15) + 1] \qquad (2)$$

where f is the lattice mismatch normalized to the InP lattice constant, or more commonly referred to as strain. This expression is for materials epitaxially grown on (100) oriented InP and in the absence of strain compensation. The strain may be determined by the portion of In or other elements present in the InGaAs semiconductor material. For example, for $In_yGa_{1-y}As$ on InP, f equals $0.032368 \times [(y-0.53)/0.47]$, where y varies between 0.0 and 1.0. When y=0.53, the $In_yGa_{1-y}As$ is lattice matched to InP. Henceforth, the term CT on nominal GaAs or In P substrates shall refer to the solution of equation (1) or (2), respectively. The term CT may also apply to the solution of equations equivalent to (1) and (2) for materials grown on other substrates. It should be appreciated that the term "Critical Thickness" is more general, but less precisely defined.

Additionally, it should be appreciated that the CT's as defined in equations (1) and (2) are valid for strained-layer structures on a thick substrate and having a sufficiently thick overlayer(s) of unstrained material grown on top. This is the structure used for most device applications. As described by Matthews & Blakeslee, and also by Coleman and by Vawter et al., absence of the thick substrate results in a doubling of the critical thickness, while absence of the overlayer halves the critical thickness. Vawter et al., in an article entitled "Useful Design Relationships for the Engineering of Thermodynamically Stable Strained-layer Structures," Journal of Applied Physics, vol. 65, pp. 4769–4773, 1989, discusses the minimum required thickness of the overlayer(s). This reference is hereby incorporated by reference.

In this context, the term "pseudomorphic" is used to describe a semiconductor material which is substantially free of misfit or threading dislocations and being constrained to the lattice constant of the substrate in the transverse direction, i.e., horizontal direction. Generally, for the purposes of this application, well-grown semiconductor layers which have a thickness below their respective CTs will be pseudomorphic. Additionally, by utilizing the teachings, one may construct a pseudomorphic semiconductor material which is above its respective critical thickness while maintaining the level of misfit dislocations which would be present if the semiconductor material had a thickness below the CT.

Before continuing with the definitions of certain terms, it is essential to explain how dislocations may be detected. In order to test for dislocations, a number of techniques are known in the semiconductor art. For example, Gourley et al. in an article entitled "Controversy of Critical Layer Thickness for InGaAs/GaAs strained-Layer Epitaxy," Appl. Phys. Lett. 52 (5), pp. 37–379, Feb. 1, 1988, describes the use of photoluminescence microscopy (PLM) to detect "dark lines" which result from dislocations. The Gourley et al. article is hereby incorporated by reference. In fact, Gourley used PLM to determine whether or not a strained layer was grown above its critical thickness. PLM may be used directly and nondestructively on VCSELs. Since EELs usually have a metallic contact over the active region, the contact must be removed in order to test the active region. Alternatively, for VCSELs or EELs, the device may be removed from its package, allowing optical access from the bottom of the device. Since both GaAs and InP substrates are fairly transparent to wavelengths over 1 μm, there is no need to remove the substrate. The presence of a single dark line is a VCSEL or EEL device is sufficient to determine that the device is not pseudomorphic.

Other techniques are available and are known in the semiconductor art. Electron beam induced current (EBIC) is another test which is nondestructive for VCSELs. EBIC detects dislocations in the active region. As with PLM, a single dislocation detected by EBIC is sufficient to determine that the structure is not pseudomorphic. High resolution electron microscopy (HREM) allows sufficiently high magnification to observe atomic dislocations as described by Fang & Morkoc, which is entitled "Integrated Optoelectronics," Academic Press, pp. 170–173, 1995. It should be appreciated that under long-term or high-stress operation, "dark lines" or dislocations will develop in any semiconductor lasers or LEDs. For the purposes of this discussion, it is assumed that the testing for dislocations is performed under conditions in which the device has undergone normal operation for 1,000 hours or less.

Turning back to the definitions, the term "peak transition energy," usually measured in units of eV, refers to the photon energy at which luminescence is highest. Energy varies inversely with wavelength and may be determined by the following formula:

$$Energy = 1.24/Wavelength \qquad (3)$$

with energy in electron volts (eV) and wavelength in micrometers.

The term "peak transition wavelength (energy)," usually is measured in μm or nm (eV), and refers to the emission wavelength (energy) of a semiconductor material at which luminescence is highest. It should be appreciated that while a semiconductor material may emit at one peak transition wavelength (energy), there are limited bands on either side of this peak transition wavelength (energy) in which light is also emitted.

It should be appreciated that we may use the term "transition wavelength (energy)" in the application. Unless specifically pointed out, we intend the term "transition wavelength (energy)" to have the meaning of the term "peak transition wavelength (energy)," defined above. It should be appreciated that there may be a significant difference between "peak transition wavelength (energy)" and "emission wavelength (energy)." Emission wavelength (energy) refers to the wavelength (photon energy) of maximum emission from the overall device. Therefore, these terms are not used interchangeably, unless specifically enumerated.

For most forms of in-plane lasers, the emission wavelength (energy) is very close to the peak wavelength (energy) of the optical gain, which in turn is very close to the peak transition wavelength (energy). For VCSELs and resonant cavity LEDs the emission wavelength (photon energy) may differ significantly from the peak transition wavelength (energy).

"Accumulated Strain" (AS) is defined as:

$$AS = \int f \, dt \qquad (4)$$

i.e., the integral over strained material thickness t of the normalized lattice mismatch f as previously defined. For strained layers of uniform composition, the AS is simply the layer thickness multiplied by f, i.e., ft. The AS is usually is measured in Å%.

The "Normalized Accumulated Strains" or NAS are the accumulated strains divided by the CAS of the compressively strained layer(s). The NAS does not have any dimensions or units.

The "Reduced Effective Strain" (RES) is based directly upon its definition in equations (4) and (5) of Vawter et al., "Useful Design Relationships for the Engineering of Thermodynamically Stable Strained Structures," J. Appl. Phys. 65 (12), pp. 4769–4773, Jun. 15, 1989. Here it is further generalized to be valid for continuously-graded layers. In this context, the RES is simply the AS divided by the total thickness of the lowest strained layer and all material grown over it. For structures having both compressive and tensile stain, the AS may be zero at one or more levels below the final growth surface. In such cases, the RES is the AS divided by the total thickness of material above the highest such zero level of the AS.

All concentrations for chemical elements are provided in ratios which range from 0.0 to 1.0, where 1.0 corresponds to 100% of that element. It should also be appreciated that when we discuss an element in a group III or V semiconductor material, the ratio applies to the concentration of the elements in either the group III or group V materials and not the entire semiconductor material. For example, an In concentration of 0.5 would correspond to 50% In concentration of the group III material used to construct the semiconductor material and not to 50% of the entire semiconductor material. This scheme is used throughout the application unless specifically enumerated. It should be appreciated that other group elements such as I, II, IV, VI, VII, VIII, transition, or rare-earth elements, in small quantities, may also be utilized in conjunction with the group III/V materials.

Turning now to the inventive concepts in this application, the concept of critical thickness will be described in relation to the invention. The critical thickness of a lattice mismatched, i.e., strained material, is qualitatively defined as the maximum thickness that a strained layer may be realistically grown without incurring a large number of misfit dislocations. Under optimal and conventional growth conditions, a strained layer which is less than the critical thickness will remain elastically strained and have a low density of atomic misfit dislocations, i.e., it will be pseudomorphic. A strained layer grown beyond the critical thickness will have a high density of dislocations and will have a strain which is at least partially relaxed. A quantitative expression for the critical thickness is provided in a paper by Matthews and Blakeslee and which is entitled "Defects in Epitaxial Multilayers: I Misfit Dislocations," published in the Journal of Crystal Growth, vol. 27, pp. 118–125 (1974). As discussed above, a more lucid discussion of critical thickness is provided in Coleman's book. As described by Anan et al. in an article entitled "Critical Layer Thickness on (111) B-Oriented InGaAs Heteroepitaxy," Applied Physics Letters, vol. 60, pp. 3159–3161, 1992, the critical thickness for a given substrate and layer composition may be different for different substrate orientations.

Figure 2A:
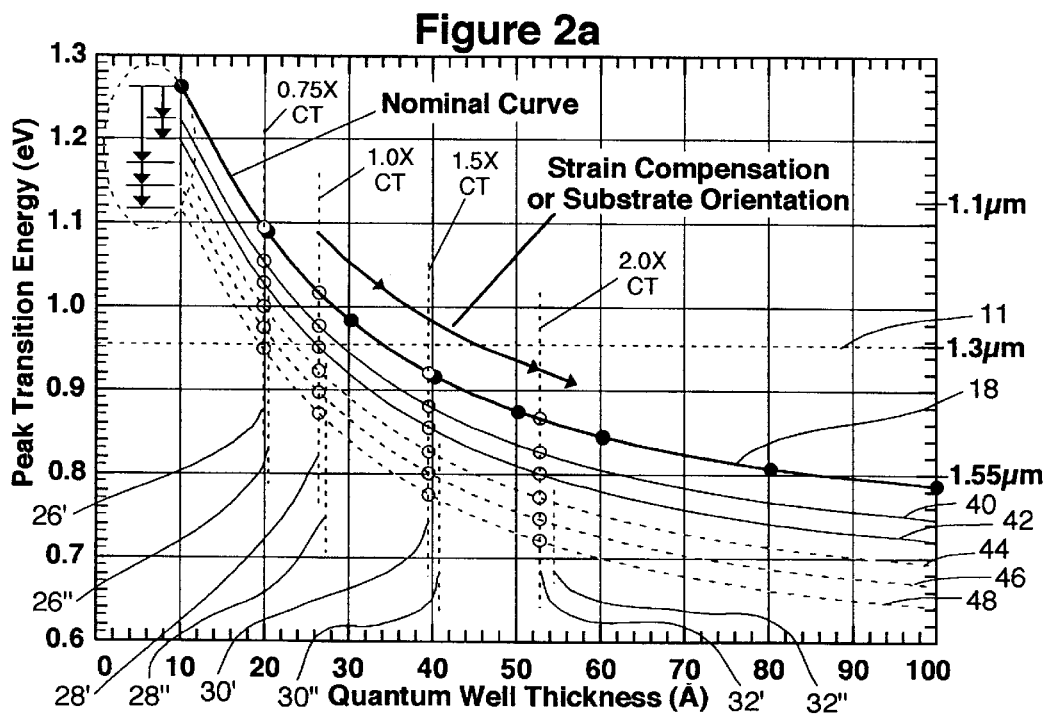
FIG. 2a is a graph of Peak Transition Energy v. Quantum Well Thickness, at 300 K, for an In concentration of 0.67 of an InGaAs strained quantum well on a GaAs substrate and also applying the effects of (1) the inclusion of superlattice structures, (2) utilizing ~0.5% nitrogen (N) in the strained quantum well, (3) utilizing a 25 meV gain offset and ~50 K temperature rise, and (4) utilizing strain compensation and/or alternative substrate orientation.

FIG. 1 illustrates a plot of the room-temperature (300 K) peak transition energy v. quantum well thickness for several In concentrations of $In_yGa_{1-y}As$ strained quantum wells on a GaAs substrate with GaAs barriers. FIG. 1 is read in conjunction with the table in FIG. 3. As may be seen, there are eight curves, each corresponding to a respective reference numeral 10, 12, 14, 16, 18, 20, 22 and 24. Curve 10 represents a 33% concentration of In in the type III semiconductor material comprising the $In_yGa_{1-y}As$ strained quantum well. This corresponds to y having a value of 0.33. As may be seen, the peak transition energy decreases as the quantum well thickness increases. For a In concentration of 0.33, the critical thickness (CT) is 71.9 Å. At the CT, the critical accumulated strain (CAS) is 170 Å%, the peak transition energy is 1.118 eV and the peak transition wavelength is 1.109 μm. The CAS in Å% is the CT in Å multiplied by the strain in %. It should be appreciated that the CT discussed with regard to FIGS. 1 and 2a are determined by equation 1.

For ease of reading, curves 26, 28, 30 and 32 are provided between curves 10, 12, 14, 16, 18, 20, 22 and 24. Curves 26, 28, 30, and 32 correspond to quantum well thicknesses of 0.75 CT, 1.0 CT, 1.5 CT, and 2.0 CT, respectively. FIG. 3 tabulates the respective values for CT equal to 1.0, 1.5 and 2.0 for the curves 10 through 24. Curves 26 through 32 allow for the easy determination of peak transition energy at particular ratios of CT. Thus, the peak transition wavelength may be determined at these particular ratios of CT. For example, for y equal to 0.33 and a CT ratio of 0.75, the peak transition energy is ~1.15 eV which corresponds to a peak transition wavelength of 1.078 μm. Curves 26, 28, 30, and 32 provide estimation of the peak transition energies at the CT for In concentrations intermediate to those provided in FIG. 3.

Turning now to curve 12, a 40% concentration of In in the type III semiconductor material comprising the $In_yGa_{1-y}As$ strained quantum well corresponds to y having a value of 0.40. The CT is 55.3 Å. At the CT, the CAS is 158 Å%. For such a quantum well at the CT, the peak transition energy is 1.080 eV and the peak transition wavelength is 1.148 μm.

Our calculations are in close proximity to Coleman's for In concentrations less than 0.5, but has found slightly shorter wavelengths for a given In concentration at the CT than Coleman has. As may be seen, longer wavelengths are achievable, but only to about 1.21–1.22 μm for In concentrations in the range from 0.6 to 0.8. As discussed by Coleman, the peak transition energy calculations partially depend on conduction and valance band offsets and there is no solid consensus on these offsets.

Turning now to curve 14, a 50% concentration of In in the type III semiconductor material comprising the $In_yGa_{1-y}As$ strained quantum well corresponds to y having a value of 0.50. The CT is 40.4 Å. At the CT, the CAS is 145 Å%. For such a quantum well at the CT, the peak transition energy is 1.042 eV and the peak transition wavelength is 1.190 μm. Curve 16, a 60% concentration of In in the type III semiconductor material comprising the $In_yGa_{1-y}As$ strained quantum well corresponds to y having a value of 0.60. The CT is 31.0 Å. At the CT, the CAS is 133 Å%. For such a quantum well at the CT, the peak transition energy is 1.026 eV and the peak transition wavelength is 1.210 μm. Turning now to curve 18, a 67% concentration of In in the type III semiconductor material comprising the $In_yGa_{1-y}As$ strained quantum well corresponds to y having a value of 0.67. The CT is 26.2 Å. At the CT, the CAS is 126 Å%. For such a quantum well at the CT, the peak transition energy is 1.019 eV and the peak transition wavelength is 1.217 μm. The remaining curves follow a similar trend until the In concentration is 100% for the group III material as illustrated by curve 24.

Prior reports such as Coleman's, disclose edge-emitting lasers grown and fabricated with strained InGaAs quantum wells. The quantum wells had 25% In, for which the CT is ~105 Å. Lasers with 100 Å quantum wells showed excellent threshold characteristics and reliability. It has been found that by increasing the thickness of the quantum wells to 125 Å, initial current thresholds were reasonable but the current thresholds doubled after testing for times on the order of a few thousand hours. The increase in thickness resulted in a high density of atomic misfit dislocations and associated problems.

We have determined that merely increasing the In concentration alone will not allow one to develop a pseudomorphic material on GaAs which has a peak transition wavelength of 1.3 μm or greater. This is because one is not able to reduce the peak transition energy to 0.954 eV or below by merely adjusting the concentration of In. The reader is referred to column 7, E(CT), of FIG. 3 and also to curve 28 of FIG. 1 which provides the peak transition energy, at CT, for different concentrations of In. We have found that the minimum peak transition energies are obtained for In concentrations in the 0.6 to 0.8 range. This contradicts the notion that by merely increasing the In concentration, one would achieve a lower peak transition energy. For example, a 100% In concentration quantum well at its CT yields a higher peak transition energy than would a 50% In concentration quantum well, as may be seen in FIG. 3.

For ease of reading, FIG. 1 is provided with a scale for selected peak transition wavelengths on the right margin of the Figure. For convenience, there is a dashed line 11 which represents a 1.3 μm emission wavelength. As discussed above, it is not possible to achieve 1.3 μm emission by merely increasing the In concentration while having the active region below its respective CT. This is illustrated in FIG. 1 by the intersection of line 28 and curves 10, 12, 14, 16, 18, 20, 22 and 24. It should be appreciated that these respective intersection points are always above dashed line 11. Thus, merely increasing In concentration will not provide the desired emission wavelength.

After extensive work, it has determined that it is possible to reduce the emission energies of pseudomorphic quantum wells on GaAs substrates to 0.954 eV or below, by any of the following procedures or combinations thereof: (1) the inclusion of superlattice structures with appropriately high In concentrations as the active layer, (2) utilizing strain compensation to increase the usable layer thickness above the CT for a InGaAs pseudomorphic active layer in the active region, and (3) utilizing small concentrations, <1%, of nitrogen (N) in the pseudomorphic InGaAsN/GaAs active layer results in a device which is capable of peak transition wavelengths of 1.3 μm or greater. In all of the above techniques, gain offset, via appropriate DBR spacing, may be utilized in VCSELs to detune the optical cavity to resonant energies lower than the peak transition energy by typically 25 meV or even by 50 meV or more. Gain offset may also be utilized in some forms of in-plane lasers. Furthermore, elevated temperatures may be used to decrease peak transition energy by about 0.5 meV/K. Additionally, "tilted" or "misoriented" substrates may be used to extend critical thickness as discussed below.

Next, the procedures identified above will be discussed in conjunction with the invention. After each discussion, an exemplary description of devices constructed in accordance with the teachings of the invention will be provided.

Superlattice

A superlattice is a plurality of superimposed semiconductor layers, each as thick as several nm or as thin as one atomic monolayer. In general, by replacing a uniform ternary alloy by a superlattice of successive periods of binary monolayers, one may produce a superlattice having the average composition of the uniform alloy, but with reduced peak transition energy. When an alloy of InGaAs is replaced with a superlattice comprising InAs and GaAs, the reduction of peak transition energy is sufficient such that combination with gain offset or with another measure permits at least a 1.3 μm emission wavelength. Previous efforts to use a superlattice for this purpose have been unsuccessful and further attempts apparently abandoned.

Figure 2B:
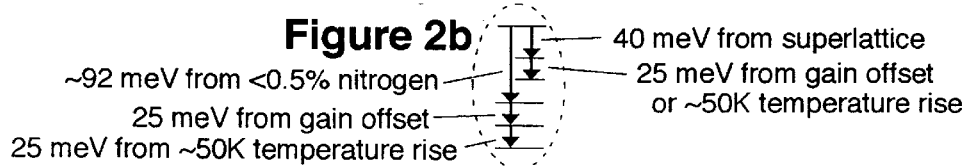
FIG. 2b is a schematic illustration of the effect on peak transition energy, at 300 K, by (1) the inclusion of superlattice structures, (2) utilizing ~0.5% nitrogen (N) in the strained quantum well, and (3) utilizing a 25 meV gain offset and ~50 K temperature rise.

Turning now to FIG. 2a, a graph of peak transition energy v. quantum well thickness is shown. Curve 18, is illustrated as a nominal curve which will be affected by the inventive techniques. As may be seen in FIG. 2b, the transition energy may be reduced by including superlattice structures. With appropriately high In concentrations in the active layer, emission wavelengths greater than or equal to 1.3 μm may be achieved. In combination with this technique, gain offset or temperature rise may be utilized. As may be seen, a reduction of about 40 meV may be achieved by utilization of a superlattice structure as described below. The effect of utilizing only a superlattice is illustrated in FIG. 2a as curve 40. An additional decrease in transition energy, typically 25 meV or even more, is possible by utilizing gain offset or a temperature rise as illustrated in FIG. 2b. The peak transition energy decreases by about 0.5 meV/K. Thus, a 50 K rise in temperature produces about a 25 meV drop in the peak transition energy. It should be appreciate that the effects of gain offset or temperature rise may be used in conjunction with each other or with any other technique described in this application. Curve 42, illustrates the cumulative effect of utilizing a superlattice with gain offset or temperature rise. As may be seen, by the intersection of curve 42 and line 28', the desired emission wavelength of 1.3 μm, as illustrated by line 11, is achievable while maintaining the active region below its respective CT. Lines 26', 30' and 32', similarly illustrate values of the 0.75 CT, 1.5 CT, and 2.0 CT, respectively. Now, we will discuss the specific superlattice structures which may be utilized in conjunction with the invention.

The concentrations of In selected for curves 10 through 24 of FIG. 1 were selected to match the concentrations achievable in binary superlattices of InAs-GaAs with integral multiples of monolayers for each. For example, the 0.67 concentration of In could be an alloy of $In_{0.67}Ga_{0.33}As$ or it could be a superlattice whose period comprises 2 monolayers of InAs followed by 1 monolayer of GaAs. It has been shown by Roan et al. that a binary superlattice may have a lower peak transition energy and longer peak transition wavelength than an alloy having the same In concentration. Roan et al. has reported a 117 meV reduction in peak transition energy in a $(InAs)_y(GaAs)_z$ superlattice, but, Roan et al. believes that this value is not due exclusively to the superlattice structure. Additionally, to our knowledge, Roan et al. has abandoned further researching this approach. We believe that this value is too high and is at least partly due to strain relaxation caused by misfit dislocation formation and that the superlattice-related shift will be approximately 40 meV instead of 117 meV. A 40 meV shift attributed to superlattice ordering is reported by Kaliteevski et al., in an article entitled "Bandgap Anomaly and Appearance of a Monolayer Superlattice in InGaAs Grown by Metal Organic Chemical Vapour Deposition," Semicond. Sci. Technol. 10, pp. 624–626 (1995). With a 40 meV shift, a binary superlattice of $(InAs)_2(GaAs)_1$ at the CT will have a peak transition energy of 0.979 eV as may be seen by the intersection of curve 40 with line 28' in FIG. 2a. This superlattice structure is illustrated in FIG. 4a. As may be seen, this structure is illustrated for an In concentration of 0.67. For clarity, only one atom of In has been labeled as reference numeral 34 in the superlattice. In a similar fashion, Ga has been labeled as reference numeral 36 while As is reference numeral 38.

One period of the $(InAs)_2(GaAs)_1$ superlattice, where y=0.67, is about 8.5 Å and the calculated CT is 26.2 Å. Thus, three periods are just below the CT. It should be appreciated that two periods yield a much thinner quantum well with a much shorter peak transition wavelength. For a $(InAs)_3(GaAs)_1$ superlattice, where y=0.75, one period is about 11.3 Å0 and the calculated CT is 22 Å. Thus, two periods slightly exceed the calculated CT by 0.6 Å. This superlattice structure is illustrated in FIG. 4b. For such thin quantum wells, even the thickness of the well is uncertain since exclusion of one GaAs monolayer outside of the well would reduce the well thickness by about 3 Å. In both the 0.67 and 0.75 examples, a 3 Å reduction in thickness brings the quantum well below the CT. It should be appreciated that the critical thickness for a superlattice may actually exceed the CT. Gourly et al. found that the critical thickness for a superlattice was measurably larger, by more than 20%, than the critical thickness for a ternary alloy having the same average composition.

For a superlattice structure of $(InAs)_4(GaAs)_1$, corresponding to y=0.8, two periods greatly exceed the CT. A single period of the superlattice is simply a InAs single quantum well and the superlattice discussion is not appropriate. Thus, there are at least two periodic binary superlattices which have a peak transition wavelength in the neighborhood of 1.3 μm while keeping below the CT. The first is a $(InAS)_2(GaAs)_1$ with three periods and the second is a $(InAS)_3(GaAs)_1$ with two periods. It should be appreciated that even these two superlattices alone do not achieve the desired wavelength of 1.3 μm but merely get close to this result. A means for achieving 1.3 μm emission wavelength will be discussed in greater detail below.

It should be appreciated that for a superlattice structure with an In concentration of 0.9 or 1.0, it is inappropriate to utilize a binary superlattice structure absent the use of strain compensation. This is because for example, if the In concentration was 0.9, there would be nine monolayers of In and this structure would be well above the CT. For the case where the In concentration is 1.0, there would be no Ga.

Turning to FIGS. 1, 2a, 2b and 3, the inventive concept of utilizing the superlattices, described above, in conjunction with gain offset to produce an emission wavelength of 1.3 μm will be discussed.

As discussed above, it has been determined that the minimum peak transition energies are obtained for In concentrations between and including 0.6 and 0.8. In an attempt to be comprehensive, we additionally discuss the In concentration of 0.5 for curve 14. It should be appreciated that these discussions may also apply to curves 10, 12 and 24.

Using the E(CT) column of FIG. 3 and curve 14 of FIG. 1, the peak transition energy with an In concentration of 0.5 is 1.042 ev for an alloy of $In_{0.5}Ga_{0.5}As$. With the use of a superlattice as described above, this peak transition energy may be reduced to 1.002 eV. Thus, a gain offset of 48 meV below the peak transition energy is required for an emission wavelength of 1.3 μm, corresponding to a the peak transition energy of 0.954 eV. This gain offset is very large and may be too large to be practical in a functioning device unless it operates at elevated temperatures as discussed below.

Using the E(CT) column of FIG. 3 and curve 16 of FIG. 1, the peak transition energy with an In concentration of 0.6 is 1.026 ev for an alloy of $In_{0.6}Ga_{0.4}As$. With the use of a superlattice as described above, this peak transition energy may be reduced to 0.986 eV. Thus, a gain offset of 32 meV below the peak transition energy is required for an emission wavelength of 1.3 μm, corresponding to a the peak transition energy of 0.954 eV. This gain offset is reasonable in a functioning device.

Using the E(CT) column of FIG. 3 and curve 18 of FIG. 1, the peak transition energy with an In concentration of 0.67 is 1.019 ev for an alloy of $In_{0.67}Ga_{0.33}As$. With the use of a superlattice as described above, this peak transition energy may be reduced to 0.979 eV. Thus, a gain offset of 25 meV below the peak transition energy is required for an emission wavelength of 1.3 μm, corresponding to a the peak transition energy of 0.954 eV. This gain offset is very reasonable in a functioning device.

Using the E(CT) column of FIG. 3 and curve 20 of FIG. 1, the peak transition energy with an In concentration of 0.75 is 1.018 ev for an alloy of $In_{0.67}Ga_{0.33}As$. With the use of a superlattice as described above, this peak transition energy may be reduced to 0.978 eV. Thus, a gain offset of 24 meV below the peak transition energy is required for an emission wavelength of 1.3 μm, corresponding to a the peak transition energy of 0.954 eV. This gain offset is very reasonable in a functioning device.

Using the E(CT) column of FIG. 3 and curve 22 of FIG. 1, the peak transition energy with an In concentration of 0.80 is 1.021 ev for an alloy of $In_{0.8}Ga_{0.2}As$. With the use of a superlattice as described above, this peak transition energy may be reduced to 0.981 eV. Thus, a gain offset of 27 meV below the peak transition energy is required for an emission wavelength of 1.3 μm, corresponding to a the peak transition energy of 0.954 eV. This gain offset is very reasonable in a functioning device.

It is interesting to note that after an In concentration of 0.75, the peak transition energy begins to increase with increased In concentration. In the case where y=0.8, the increase in the peak transition energy may still be compensated for by utilizing an appropriate superlattice and gain offset as discussed above. After y is greater than 0.8 it becomes increasingly more difficult to compensate for the increase in peak transition energy by selecting an appropriate superlattice and gain offset.

There are also a limited number of aperiodic superlattices which may accomplish a similar result of a peak transition wavelength in the neighborhood of 1.3 μm while keeping below the CT. For example, a structure comprising:

$(InAs)_1(GaAs)_1(InAs)_2(GaAs)_1(InAs)_2(GaAs)_1(InAs)_1$ bounded by GaAs on both sides and denoted by the formula $I_1G_1I_2G_1I_2G_1I_1$ accomplishes the required result. This aperiodic superlattice is illustrated in FIG. 4c and has an In concentration of 67%. For y=0.67, one period of the $I_1G_1I_2G_1I_2G_1I_1$ superlattice, the calculated CT is 26.2 Å and is about this thickness. The peak transition energy for this quantum well superlattice is estimated to be 0.979 eV.

Another example is the aperiodic superlattice $(InAs)_1$ $(GaAs)_1(InAs)_4(GaAs)_1(InAs)_1$ bounded by GaAs on both sides and denoted by the formula $I_1G_1I_4G_1I_1$ which also accomplishes the required result. This aperiodic superlattice is illustrated in FIG. 4d and has an In concentration of 60%. For y=0.60, one period of the $I_1G_1I_4G_1I_1$ superlattice, the calculated CT is 31 Å and is about this thickness. The peak transition energy is calculated to be 0.986 eV.

Yet another example is the aperiodic superlattice $(InAs)_2(GaAs)_2(InAs)_4(GaAs)_2(InAs)_2$ bounded by GaAs on both sides and denoted by the formula $I_2G_3I_2$ which also accomplishes the required result. This aperiodic superlattice has an In concentration of 60%. Two periods of the $I_2G_2I_4G_2I_2$ superlattice is about 30 Å and the calculated CT is 31 Å. Thus, two periods are well below the CT. The peak transition energy for this quantum well superlattice is calculated to be 0.996 eV. Yet another example is $I_2G_1I_3G_1I_2$ having an average In concentration of 70%.

In the preceding examples, the determinations of the average In concentrations include the presence of ½ monolayer of GaAs on either side. It should be appreciated the above superlattices are merely exemplary and that there are other superlattices, including nonbinary superlattices, which may be used in conjunction with the invention. For example, a superlattice comprising alternating monolayers of InGaAs having 50% In and InAs has an average In concentration of 75%. Also, superlattices comprising other elements, such as, but not limited to Sb, may be used. The requirements of any superlattice which is contemplated by this invention is a superlattice with the following characteristics: (1) the overall lattice must have a sum of In and Sb concentrations of 0.5 or greater; (2) the strained layers used for the formation of the superlattice must have a thickness below the CT for the associated semiconductor material; and (3) the peak transition energy must be sufficiently low, e.g., 1.0 eV, such that the inclusion of gain offset in VCSELs and/or elevated temperature results in an emission wavelength of 1.3 μm or greater for devices on GaAs substrates and 2.5 μm or greater for devices on InP substrates.

Strain Compensation

Developments in epitaxial growth techniques such as molecular beam epitaxy (MBE) and organometallic vapor phase epitaxy (OMVPE) have made it possible to grow multi-component epitaxial heterostructures with precise composition and thickness control. These new methods have paved the way for growing pseudomorphic lattice-mismatched strained structures different from those possible at equilibrium. Consequently, artificially layered structures that are lattice mismatched may be realized and investigated but the degree of usable mismatch and thickness are subject to limitations such as those described by Matthews & Blakeslee.

The mechanisms describing epitaxial growth on a substrate with a different lattice constant are very much dependent on the materials involved and details of the overall structure. The lattice-mismatched layer is assumed to be strained coherently without the generation of large amounts of misfit dislocation defects under appropriate growth conditions and if the layer thickness is kept below a critical thickness. The strain in a layer with a lattice deformation of $\Delta a$ is:

$$f = \Delta a / a_0 \quad (5)$$

where $a_0$ is an undeformed lattice constant. The misfit strain energy increases with the thickness of a strained layer. When the thickness of a strained layer reaches a critical value, it becomes energetically favorable for misfit dislocations to be generated. The strain will be gradually relaxed by misfit dislocations as the layer thickness increases. Dislocations in an active layer degrade device properties as discussed above. Therefore, the prior art has appreciated that it is important to grow strained layers within the CT. Otherwise, the strained layer would be partially or completely relaxed.

If a single quantum well is grown at nearly the CT, followed by the growth of a thin unstrained barrier, and then by a second, similar quantum well, misfit dislocations will occur as discussed above. This is because the strain forces of the two quantum wells accumulate to exceed the allowed strain force. In cases where it is desirable to have multiple quantum wells, each with maximum strain, a technique called "strain compensation" is used to grow large numbers of such wells in succession. In strain compensation, the accumulation of compressive strain forces are balanced by the introduction of tensile strain between the wells. For this discussion, it is assumed that the quantum wells are compressively strained and the surrounding barriers are tensely strained. However, it should be appreciated that strain compensation may be used in the opposite manner also, i.e., the quantum wells are tensely strained and the surrounding barriers are compressively strained. Use of strain compensation to increase the number of strained quantum wells which may be grown without dislocations is frequently used in the prior art and is described by Zhang and Ovtchinnikov in an article entitled "Strain-compensated InGaAs/GaAsP/GaInAsP/GaInP Quantum Well Lasers (λ~0.98 μm) Grown by Gas-Source Molecular Beam Epitaxy," Applied Physics Letters, vol. 62, pp. 1644–1646, 1993, which is hereby incorporated by reference, see also U.S. Pat. No. 5,381,434 by Bhat and Zah.

It is also possible to use strain compensation to grow a strained quantum well up to twice its critical thickness without creating misfit dislocations as described by Hoke in U.S. Pat. No. 5,060,030, which is hereby incorporated by reference. To grow an increased thickness strained quantum well, a layer of oppositely strained material is grown first. For example, to grow an increased-thickness compressively strained quantum well, a layer of tensely-strained material is grown first. Then, when the compressively-strained layer is grown to its nominal CT, the accumulated strain of the tensely-strained layer is subtracted from the accumulated strain in the well, reducing the forces which generate misfit dislocations. To a first approximation, a compressively-strained layer may be grown to about twice its nominal critical thickness before the accumulated strain force is once again at the level which will form dislocations. Not disclosed by Hoke, but preferably included, is a second oppositely-strained layer is grown over the quantum well to bring the accumulated strain once again to approximately zero.

Thus, small-lattice-constant material layers, consequently in tension as epitaxially grown on GaAs based material may average out compressive strain in the large lattice-constant emitter layer. Such "tensely strained" layers may be functionally inert spacers or may be part of mirror or other functioning parts of the structure. They may serve to permit increased thickness of a homogenous emitter layer or may be used to increase the number of quantum wells in a Multiple Quantum Well (MQW) structure.

FIG. 5 schematically illustrates the use of strain compensation to grow pseudomorphic semiconductor layers above their nominal critical thickness, e.g., above the CT. In FIG. 5, the vertical axis represents the lattice constant of the growth material, with the horizontal axis positioned at the lattice constant of the substrate. Thus, compressively-trained material is represented above the horizontal axis and tensely-strained material below the axis. The horizontal axis represents the growth direction. An excessive accumulation of compressive or tensile strain above the critical accumulated strain for the material being grown (CAS column in FIG. 3) represents the onset of misfit dislocations. In FIG. 5, the normalized accumulated strains (NAS) are the accumulated strains divided by the CAS of the compressively strained layer(s).

For a strained layer as in FIG. 5a, its maximum thickness is the CT and the NAS is +1. In FIG. 5b, a tensely-strained layer is grown to an arbitrary thickness (but approximately equal to or less than its CT) with a NAS of –X, followed by growth of a compressively-strained layer having a NAS of 1+X. The total NAS is +1. Nowhere in the growth does the magnitude of the total NAS exceed 1. An extension of this concept is illustrated in FIG. 5c in which the total NAS is approximately zero. Following the growth of a tensely-strained layer with NAS of –X, a compressively-strained layer with NAS of +2X is grown, bringing the NAS to +X. This layer is followed by growth of another tensely-strained layer with N NAS of –X, so that the final NAS is zero. In all of the above examples, when X is >0.5, the compressively-strained layer thickness exceeds its CT and when X=1 the compressively strained layer is grown to twice its CT.

It is furthermore possible to have a NAS <–1 for the tensely-strained layer while still keeping the tensely-strained layer below its critical thickness. This occurs when the magnitude of the tensile strain is less than that of the compressive strain because a layer having a smaller strain has a larger CAS (see FIGS. 3 and 6). This may allow the pseudomorphic growth of layers to more than twice their CT.

Rather than having abrupt interfaces between the compressively- and tensely-strained layers as shown in FIG. 5b and 5c, it may be advantageous to have graded interfaces as shown in FIGS. 5d, 5e, and 5f. FIG. 5d shows a stepped interface; FIG. 5e shows a superlattice interface; and FIG. 5f shows a smoothly graded interface. Stepped interfaces, and especially the smoothly graded interfaces, minimize the local strain forces at any location and therefore minimize the likelihood of dislocations. Thus, a quantum well may actually be grown to more than its CT without creating high densities of misfit dislocations. Multiple quantum wells, each significantly above their critical thickness, may be grown using the strain-compensating structure represented in FIG. 5g. Although stepped interfaces are illustrated in FIG. 5g, abrupt or any other graded interface may be used in conjunction with the inventive concept. In FIG. 5g, the final NAS is zero throughout the entire growth and at no level does the AS exceed the CAS for the material at that level. It should be appreciated that the final NAS does not need to be exactly zero. It should be appreciated that the shape of the graded interfaces in FIGS. 5d, 5e, and 5f are merely illustrative of the concept of graded interfaces. The invention contemplates any graded interface which minimizes the overall strain of the respective layers as within the scope of the invention.

As discussed above, pseudomorphic strained layers exceeding the CT may be grown. Strained as-deposited layers in the pseudomorphic state may relax if the thermal treatment associated with device growth or fabrication is too high. Strained-layer breakdown is most directly determined by an excess stress (the difference between that due to misfit strain and that due to dislocation line tension) and temperature. Elevated temperatures provide additional lattice energy to help overcome the interatomic forces which would otherwise keep the lattice in its pseudomorphic state. This strain layer breakdown may be prevented by: (1) providing strain compensation as discussed above and throughout the entire growth process, maintaining the accumulated strain below the critical accumulated strain of the material being grown; and (2) maintaining the temperature of the growth material and other growth parameters at appropriate levels for the method of growth and the strain. It should be appreciated that both strain and method of growth will affect the maximum usable growth temperature.

FIG. 3 shows that the accumulated strain of a single $In_yGa_{1-y}As$ quantum well at its CT, i.e., the CAS, varies with the lattice mismatch. The same is true for any strained layer. The force exerted by the misfit strain is proportional to the accumulated strain (AS) as defined previously, and this is the mechanism behind the linear term in the CT equation above, i.e., the left hand side of equations 1 and 2. The right hand side of equations (1) and (2) denotes the line transition of dislocation which acts to resist the formation of dislocations.

FIG. 6 provides data for $GaAs_{1-z}P_z$ for z, the strain, CT, and accumulated strain, respectively in the four columns. Different design strategies are now described by means of examples. The examples are by no means meant to limit the scope of the invention, only to better communicate its implementation. Furthermore, although the structures are described in terms of having abrupt interfaces of the type illustrated in FIGS. 5a, 5b and 5c, it is understood that other interface types may be employed in the same fashion, such as the interface types illustrated in FIGS. 5d, 5e, 5f, and 5g as well as the other alternatives described above. The AS, since it is defined as an integral, is valid for any form of interface or quantum well profile including but not limited to: steps, grades, and superlattices.

The accumulated strain AS and strain compensation are most easily understood when the tensile and compressive strained materials have the same magnitude of lattice mismatch, but opposite signs. The first example is $In_yGa_{1-y}As$ with y=0.5 and $GaAs_{1-z}P_z$ with z=1.0. The latter is GaP, and both materials have lattice constants differing from that of GaAs by about 3.6%. FIG. 3 shows that a quantum well width of about 80 Å is required for 1.3 μm peak transition with y=0.5 $In_yGa_{1-y}As$, that this is 1.98 times the CT for y=0.5, and that the accumulated strain is 287 Å%. Thus to grow a 1.3 μm emitting $In_yGa_{1-y}As$ quantum well with y=0.5 while keeping the accumulated strain below 145 Å%, the GaP layer is first grown to its CT of 40 Å to produce an accumulated strain of –144 Å%. Then the y=0.5 $In_yGa_{1-y}As$ layer is grown. When it reaches a thickness of 80 Å, the total accumulated strain is (–144+287)Å%=143 Å%, which is just below the allowable accumulated strain of 145 Å% corresponding to the CT of y=0.5 InGaAs. The 2-layer structure would then resemble that of FIG. 5b. Preferably, another symmetric tensile layer of GaP would be grown to bring the total accumulated strain back to approximately zero, similarly to the illustration of FIG. 5c.

For 1.3 μm emission, the structure described in the preceding paragraph is undesirable in that the GaP and InGaAs layers are grown nearly to maximum pseudomorphic thicknesses. While such a structure may be grown, it is preferred to produce structures which do not press so close to such physical limits. FIGS. 1 and 3 show that 1.3 μm emission is better reached with higher In concentrations in the $In_yGa_{1-y}As$ layer(s).

The next example, a $y=0.6$ $In_yGa_{1-y}As$ well is used. This material has a strain of +4.3%, and a CT of 31 Å at which the accumulated strain is 133 Å%. For 1.3 μm emission, a well thickness of about 44 Å is needed which is 1.42 times the CT. A $z=0.7$ $GaAs_{1-z}P_z$ material is used for this example, which has −2.52% strain, and a CT of 66 Å at which the CAS is −166 Å%. The $In_{0.6}Ga_{0.4}As$ quantum well for this example is 50 Å thick (1.61 times its CT), having an accumulated strain of 215 Å%. Its calculated that the peak transition wavelength from FIG. 1 is 1.333 μm, though the actual emission wavelength may be slightly shorter due to the high-bandgap $GaAs_{0.3}P_{0.7}$ barrier layers. To compensate the accumulated strain of the $In_yGa_{1-y}As$ well, $GaAs_{0.3}P_{0.7}$ barriers are designed to produce −107.5 Å% of accumulated strain on either side of the well. The $GaAs_{0.3}P_{0.7}$ barriers are thus each 43 Å thick, which is only 0.65 times their CT. Nowhere in the growth of this structure does the magnitude of the total accumulated strain exceed 107.5 Å%, i.e., it is always less than the magnitude of the CAS of either of the strained materials.

A similar example is now described, which used the same $y=0.6$ $In_yGa_{1-y}As$ well as the previous example. The difference is that $GaAs_{0.5}P_{0.5}$ material is used for this example, which has −1.8% strain, and a CT of 103 Å at which the accumulated strain is −185 Å%. The $GaAs_{0.5}P_{0.5}$ barriers to produce −107.5 Å% of accumulated strain on either side of the well are each 60 Å thick, which is only 0.58 times their CT. Nowhere in the growth of this structure does the magnitude of the total accumulated strain exceed 107.5 Å%, i.e., is always less than the accumulated strain corresponding to the CT of either of the strained materials.

An example is now described using a $y=0.8$ $In_yGa_{1-y}As$ well which has a strain of +5.73%, and a CT of 19.8 Å at which the accumulated strain is 114 Å%. A $GaAs_{0.7}P_{0.3}$ material is used for this example, which has −1.08% strain, and a CT of 199 Å at which the accumulated strain is −215%. The $In_{0.8}Ga_{0.2}As$ quantum well for this example is 50 Å thick (2.43 times its CT), having an accumulated strain of +287 Å%. Its calculated peak transition wavelength from FIG. 1 is 1.59 μm, though the actual emission wavelength may be slightly shorter due to the high-bandgap GaAsP barrier layers. To compensate the accumulated strain of the $In_yGa_{1-y}As$ well, a 185 Å thick $GaAs_{0.7}P_{0.3}$ barrier is first grown to produce −200 Å% of accumulated strain at 0.93 of its CT. The $y=0.8$ InGaAs well is then grown. At the end of the $In_yGa_{1-y}As$ growth, the total accumulated strain is (−200+287)=+87 Å%, which is well below the critical accumulated strain for $y−0.6$ InGaAs. Preferably, an 80 Å thick $z=0.3$ GaAsP tensile strained layer is grown to bring the total accumulated strain to approximately zero. Nowhere in the growth of the $y=0.8$ well does the accumulated strain exceed the well's CAS of +114 Å%, nor during the growth of the $z=0.3$ material does the accumulated strain fall below its CAS of −215 Å%.

A final example is now described for a multiple quantum well structure using a $y=0.6$ InGaAs well which has a strain of +4.3% and a CT of 31 Å at which the CAS is 133 Å%. To provide the strain compensation, a $z=1.0$ GaP material is used, which has −3.6% strain, and a CT of 40 Å at which the CAS is −144 Å%. Each $y=0.6$ InGaAs quantum well, for this example, is about 50 Å thick (1.61 times its CT), having a targeted accumulated strain of +216 Å%. To compensate the AS of the InGaAs wells, the first $z=1.0$ GaP barrier is grown 30 Å thick to produce −108 Å% of accumulated strain at 0.75 of its CT. The first 50 Å thick $y=0.6$ InGaAs well is then grown. At the end of this InGaAs growth, the total AS is (−108+216)=+108 Å%. A second GaP barrier is then grown to a thickness of 60 Å, contributing −216 Å% to the AS, bringing the AS to −108 Å%. A second 50 Å thick $y=0.6$ InGaAs quantum well is then grown. At the end of this InGaAs growth, the total AS is again (−108+216)=+108 Å%. A number of additional GaP barriers and InGaAs wells may be grown in a similar fashion, for example, producing 7 or more quantum wells, ending with the InGaAs well and an AS of +108 Å%. Preferably, a final GaP strain-compensating barrier is grown similarly to the initial one, i.e., 30 Å thick to contribute −108 Å% to the AS. In this case, the final AS is close to zero. Nowhere in the growth of the strained materials does the AS exceed the CAS of either of the constituent materials.

Figure 7:
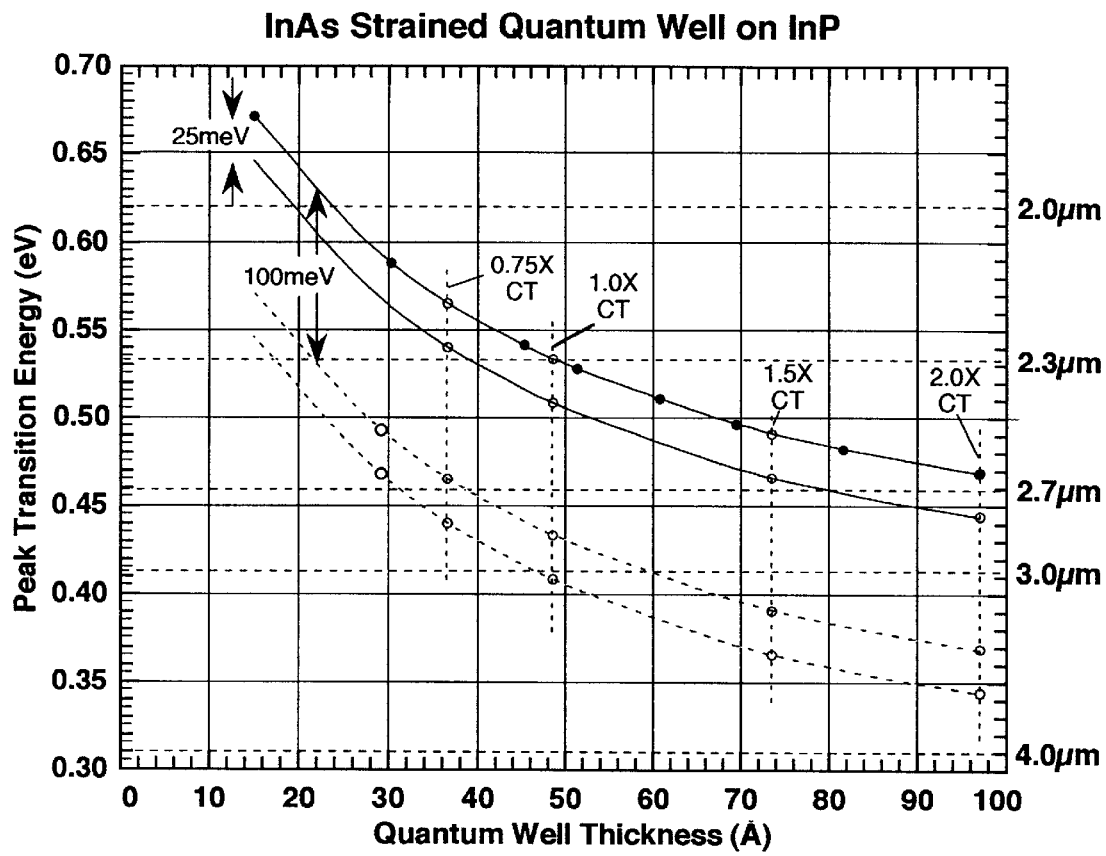
FIG. 7 is a graph of peak transition energy v. quantum well thickness for strained InAs quantum wells on a InP substrate, at 300 K, and also applying the effects of 1) utilizing ~0.54% nitrogen, 2) utilizing ~20% Sb, and 3) utilizing a 25 meV gain offset and ~50 K temperature rise.

For a graphical representation of the effect of strain compensation on an active material, the reader is referred to FIGS. 1, 2a and 7. As may be seen, in FIG. 1, by utilizing strain compensation, possibly in combination with appropriate substrate orientation, one is able to grow the active material to 2× the CT or even greater. One may see by the intersection of line 32 with curves 14, 16, 18, 20, 22 and 24 that all of these intersections fall below line 11. Thus, for In concentrations equal to or greater than 0.5, it is possible to achieve peak transition emissions of 1.3 μm or greater. Similarly, in FIG. 2a, one may move down respective curves 18, 40, 42, 44, 46, and 48 to line 32' and even to line 32" if nitrogen is used as discussed below.

It should be appreciated that strain compensation may be combined with the superlattice structures discussed above or any of the other techniques discussed below. Discussions on strained layer superlattices are provided by Dagenais et al., which is entitled "Integrated Optoelectronics," Academic Press, pp. 175–178, 1995. This book is hereby incorporated by reference. This technique may also be combined with Nitrogen-containing active layers as discussed below.

Nitrogen-Containing Active Layers

Very recently it has been shown that the compound InGaAsN may have some favorable qualities for producing 1.3 μm lasers on GaAs substrates, see Kondow et al., in Japanese Journal of Applied Physics, vol. 35, pp. 1273–1275, 1996. InGaAsN may be thought of as an alloy of GaAs, InAs and GaN. Compared to the lattice constant of GaAs, GaN has a lattice constant about 20% smaller, and InAs has a lattice constant about 7% larger. Thus, on GaAs substrates the lattice mismatch of GaN is about 3 times that of InAs and of the opposite sign. Therefore InGaAsN lattice matched to GaAs will have about 3 times as much In as N. A room-temperature photoluminescence spectrum of a 70 Å thick $In_{0.3}Ga_{0.7}As_{0.99}N_{0.01}$ quantum well showed significant broadening. The peak wavelength of photoluminescence was 1.232 μm, while the peak wavelength for a 70 Å thick $In_{0.3}Ga_{0.7}As$ well was 1.088 μm. In this report the authors state that their plan to reach 1.3 μm wavelengths is to increase the N content.

In calculating the CT for nitrogen-containing materials, the decrease in lattice constant due to the nitrogen should be taken into account. Kondow et al., has shown GaN to have a lattice constant of 4.5 Å in the context of being grown on GaAs substrates. The lattice mismatch is thus ~20.35%, which is about 3 times the lattice mismatch between InAs and GaAs and of the opposite sign. Thus, the addition of 1% N to the InGaAs compound produces a lattice constant approximately equal to the original InGaAs, with the In content reduced by 3%. For example, the CT of InGaAs with $y=0.3$ is about 82 Å and the CT for $y=0.27$ is about 94 Å. The CT of an $In_{0.3}Ga_{0.7}As_{0.99}N_{0.01}$ quantum well should therefore be about 94 Å, corresponding to the y=0.27 InGaAs quantum well.

Apparently it is difficult to grow laser-quality InGaAs with large N contents. Our calculations, described above, favor high In concentrations to approach 1.3 μm emission on GaAs substrates. Therefore, contrary to the approach taken by Kondow et al., we have determined that 1.3 μm emission would be better achieved by increasing the In content, rather than the N content. Given the result that a 1% N content decreases the transition energy by 185 meV, as published by Kondow et al., it follows that a InGaAs quantum well with a transition energy less than 1.139 eV, if modified by replacing 1% of the As with N, would be brought to the desired 0.954 eV transition energy which corresponds to a peak transition emission of 1.3 μm. Our calculations for a $In_{03}Ga_{0.7}As_{0.99}N_{0.01}$ quantum well are as follows. The CT is about 94 Å, similar to a $In_{0.27}Ga_{0.73}As$ quantum well since the nitrogen reduces the lattice constant as discussed above. The peak transition energy for a 94 Å thick $In_{0.27}Ga_{0.73}As$ quantum well is about 1.122 eV. Subtracting the 185 meV for the 1% nitrogen yields 0.937 eV or a peak emission wavelength of 1.32 μm. Referring again back to FIG. 3, it is seen that a 1.118 eV transition energy may be achieved with an $In_{0.33}Ga_{0.67}As$ quantum well which is still below the CT. Thus a nominal InGaAs quantum well with 33% or more In may be brought to a peak transition wavelength of ≧1.3 μm by the incorporation of about 0.89% N. The $In_{0.4}Ga_{0.6}As$ quantum well with 40% In at its CT has a transition energy of about 1.080 eV, just 126 meV above the desired 0.954 eV. Thus, a 0.68% nitrogen concentration would be needed to bring the quantum well to a 1.3 μm peak transition wavelength. The $In_{0.5}Ga_{0.5}As$ well with 50% In at its CT has a transition energy of about 1.05 eV, just 96 meV above the desired 0.954 eV. Thus a 0.52% N concentration would be needed to bring it to a 1.3 μm peak transition wavelength. The InGaAs quantum wells discussed earlier with 67%, 75% and 80% In had transition energies about 66 meV above the desired 0.954 eV. Thus they may be converted to 1.3 μm emitting quantum wells by incorporating only about 0.35% N. In the above inventive examples, the increase in CT was not included. Thus, the 1.3 μm peak transition wavelength may be accomplished with nitrogen levels lower than specified in the examples, or at thicknesses below the respective CTs. The use of nitrogen incorporation in combination with gain offset allows the attainment of 1.3 μm emission wavelengths with peak transition energies higher than 0.954 eV, by typically 25 meV or even more. This allows further reductions in nitrogen content and/or quantum well thicknesses.

Turning now to FIGS. 2a and 2b, the effect of nitrogen is illustrated for a quantum well having 0.67 In concentration. Nominal curve 18 is modified by the incorporation of 0.5% N to form curve 44. FIG. 2b illustrates that a reduction in transition energy of approximately 92 meV is possible by the introduction of ~0.5% nitrogen at any In concentration. Furthermore, due to the decreased lattice constant, the CT is increased slightly. The 0.5% nitrogen composition therefore increases the CT from 26.2 Å to about 27.2 Å. This is indicated by the vertical dashed line 28". Lines 26", 30" and 32", similarly illustrate increased values of the 0.75 CT, 1.5 CT, and 2.0 CT, respectively. As may be seen from the intersection of curve 44 with line 28", the transition energy is 0.917 eV and the desired peak transition wavelength of 1.3 μm is achievable while maintaining the active region below its respective CT. For VCSELs, an additional decrease in emission energy, typically 25 meV, or even more, is possible by utilizing gain offset as illustrated in FIG. 2b. Curve 46, illustrates the cumulative effect of utilizing 0.5% nitrogen in combination with gain offset.

Additional reductions of the peak transition energy may be accomplished by elevating the temperature of the material or device. The peak transition energy decreases by about 0.5 meV/K. Thus, a 50 K rise in temperature produces about a 25 meV drop in the peak transition energy. Curve 48 in FIG. 2a illustrates the cumulative effect of utilizing 0.5% nitrogen in combination with 25 meV of gain offset and furthermore in combination with 25 meV reduction in peak transition energy due to a temperature rise of about 50 K (about 50° C.). It is to be appreciated that reduction in peak transition energy of more than 25 meV or less than 25 meV may be accomplished via larger or smaller temperature rises, respectively. It is also to be appreciated that the reduction in peak transition energy via temperature rise may be accomplished independently of any of the other techniques or in combination with any of the techniques discussed in this application. Only a subset of the possible combinations are illustrated in FIG. 2a in order to better elucidate the individual effects and select combinations. Therefore, FIG. 2a is merely illustrative of these select combinations and is not intended to restrict the inventive concept to merely these combinations. Thus, the use of small nitrogen contents in combination with any combination or other techniques described herein produce a decrease in the required nitrogen content, decrease in the required quantum well thickness, or other desirable material attributes.

Therefore, it has been shown that partial substitution of As by N increases peak transition wavelength. Use of small amounts of N, i.e., less than or equal to 0.95% of the total group V element content, together with substantial In content, greater than or equal to 33% or y=0.33, permits pseudomorphic structures which emit at 1.3 μm or greater.

Gain Offset

The term "gain offset" in a VCSEL refers to the non-coincidence of the cavity resonance from the peak of the photoluminescence or electroluminescence emission spectrum of the light-emitting active region (peak transition wavelength). The full-width-at-half-maximum of this spectrum under low excitation is typically about 15 nm at 850 nm wavelengths, or about 25 meV to 50 meV in energy units. VCSELs typically have adjacent resonance's separated by 50 nm to 100 nm, thus only one resonance may lie within the emission spectrum. As a consequence, the wavelength of this resonance is the wavelength at which the VCSEL may lase. The VCSEL, threshold is lowest when the peak of the gain spectrum (gain peak) coincides with the cavity resonance. To complicate matters, the gain spectrum does not necessarily coincide with the emission spectrum. However, it is generally difficult to measure the gain spectrum experimentally; thus, in the literature, "gain offset" refers to the difference in wavelength or energy between the cavity resonance and the peak of the emission spectrum (peak transition wavelength (energy)). Use of the term "gain offset" herein is the same. Thus, the term "gain offset" as used herein provides a direct relation between the calculated peak transition wavelength (energy) and the VCSEL lasing wavelength (photon energy).

Gain offset is used to reduce temperature sensitivity of VCSEL operating currents. The peak transition wavelength (and peak of the gain spectrum) increase with temperature at a rate of about 3 Å/K, while the cavity resonance wavelength also increases but, at about 0.6 Å/K. Thus, if the resonance and gain peak coincide at one temperature, they will not at other temperatures. If the cavity resonance is tuned to a longer wavelength than the gain peak at room temperature, then a small increase in temperature will bring them closer to coincidence. This helps to compensate for the reduction in magnitude of the gain spectrum which also accompanies the rise in temperature. Depending on the amount of detuning and shape of the gain spectrum, a slight rise in temperature may result in the operating current (for a given power output) rising, lowering, or not changing at all. For Resonant cavity LEDs, the effects of "gain offset" are similar even though there is no actual net gain and the emission is not lasing emission.

Young et al., in an article entitled "High-Power Temperature-Insensitive Gain-Offset InGaAs/GaAs Vertical-Cavity Surface-Emitting Lasers," IEEE Photonics Technology Letters, pp. 129–132, February 1993, reports optimum temperature insensitivity in a VCSEL emitting at 997 nm. The photoluminescence emission peak wavelength was at 972 nm, an offset from the cavity mode of 25 nm (32 meV). Likewise, Catchmark et al., in an article entitled "High Temperature CW operation of GaAs/AlGaAs High Barrier Gain Offset VCSELs," Electronics Letters, vol. 30 no. 25, pp. 2136–2138 (Dec. 8, 1994), reports a VCSEL emitting at 873.5 nm which has a gain offset of ~35 nm (59 meV). A more optimized VCSEL has a gain offset of 20 nm (34 meV). The active regions of these VCSELs had five (5) quantum wells, as compared to the more typical one (1) to three (3) quantum wells used in VCSELs. Thus, the overall gain is higher., which allows for a higher gain offset.

It is to be appreciated that for some forms of edge-emitting (in-plane) lasers, it is possible to use gain offset. The necessary condition for the use of gain offset is that the laser cavity resonances which may produce lasing are spaced sufficiently far apart that adjacent resonances lie in regions of the gain spectrum having significantly different gain. In-plane lasers satisfying this requirement include distributed feedback (DFB) lasers and phase-shifted DBF lasers. Such lasers may utilize gain offset as discussed above.

Substrate Orientation

Fisher et al. in articles which have appeared in Appl. Phys. Lett. 48, 1223 (1986) and J. Appl. Phys. 61, 1023 (1987) studied the effectiveness of substrate tilt in reducing dislocation density. These articles are hereby incorporated by reference. In their sturdy, three different substrates were utilized: (100), 4° off toward (011) and 4° off toward (001). It was found that the epilayer on the exact (100) contains massive dislocation networks which thread from the GaAs interface to the surface. The epilayer thickness was about 2 mm. The dislocation density near the surface is as high as $10^{10}$ cm$^{-2}$. In addition, to threading dislocations, a large number of stacking faults are present along (111).

The epilayer on the substrate misoriented 4° toward (011) has fewer dislocations than the exact (100) sample. The dislocations are also confined to a region approximately 1 $\mu$m thick from the GaAs interface. The dislocation density near the film surface is approximately tow to three orders lower than that of the exact (100) sample. The tilt toward (001) reduces the surface dislocation density even further. The further reduction in this case is due to steps running in both (011) and (014) directions, which provide a greater number of sources (steps) for the generation of misfits to accommodate the lattice mismatch.

Anan et al. in an article entitled "Critical Layer Thickness on (111) B-Oriented InGaAs Heteroepitaxy," Applied Physics Letters, vol. 60, pp. 3159–3161, 1992, elucidate the increase in critical thickness gained by using substrates having (111)B orientation and tilted 2° toward (011). An increase by a factor of 2 over the critical thicknesses for layers grown on (100) substrates is obtained experimentally and theoretically based on the methodology introduced by Matthews and Blakeslee The numerical coefficients in equations (1) and (2) of this application are based upon material parameters including the angles at which dislocations tend to propagate, the elastic coefficients of the materials, and other properties. They were considered in equations (1) and (2) for simplicity. These values may differ for different substrate orientations, and in fact yield significantly larger predicted critical thicknessess for the (111) substrate orientation than for the (100) oriented substrates. Experimental data presented in the article also shows that growth at lower temperatures allows thicker layers to be grown before the onset of relaxation by dislocations. Although the experimental results are obtained via growth by MBE, the theoretical predictions are equally valid for any growth technique. It is important to note that Anan et al., monitored the dislocation formation in situ during the growth. Thus, the strain relaxation was observed without the presence of an overlayer. Thus, the critical thickness measured should be a factor of 2 smaller than for strained layers which have a thick overlayer of unstrained material, as previously discussed.

Anan et al., have shown that the critical thicknesses, based on the methodology of Matthews and Blakeslee, has a significant dependence upon substrate orientation. In particular, for the (111) substrate orientation, the critical thickness is calculated to be larger than for (100) substrates, by a factor of approximately two. The main effect was found to be the angular relationship between the growth plane and the preferred direction of dislocation propagation for zinc-blende crystals. The authors make no mention of lasers or of the advantages of extending wavelength. This article is hereby incorporated by reference.

Thus, the critical thickness attainable on (111) oriented GaAs substrates is twice the CT which solves equation (1) and the present invention contemplates its use for the achievement of lasers grown on GaAs substrates and which emit light at 1.3 $\mu$m or longer wavelengths. Since InP has the same zinc-blende structure as GaAs, similar advantages may be expected for extending the emission wavelength for materials grown on InP substrates. Thus, the critical thickness attainable on (111) oriented InP substrates is twice the CT which solves equation (2) and the present invention contemplates its use for the achievement of lasers grown on InP substrates and which emit at 2.5 $\mu$m or longer wavelengths.

The effect of using (111) substrates rather than (100) may be seen in FIGS. 1a, 2a, and 7. The change of substrate orientation (by itself) allows pseudomorphic growth at up to two times the CT, rather than one times the CT. If combined with other techniques, use of nominal (111) orientations may allow pseudomorphic growth to well above two times the CT.

A by-product of the use of nominal substrate orientations such as the (111) orientation is that the strain may induce electric fields, via the piezoelectric effect. For growth on nominal or slightly tilted (100) substrates this does not occur. The electric fields actually cause a decrease in peak transition energy of the strained quantum wells and thus may be used to further increase the peak transition wavelength. Laurich et al., in an article entitled "Optical Properties of (100) and (111) Oriented GaInAs/GaAs Strained-Layer Superlattices," Physics Review Letters, vol. 62, pp.

649–652, 1989 reports a 20 meV shift toward longer wavelengths in structures grown on (111)B substrates compared to those grown on (100) substrates. The In content was lower and the layer thicknessess were thicker than for the structures disclosed in the present invention. Thus, the structures described herein may exhibit much larger electric filed effects. A 20 meV shift is nearly the same as the 25 meV shifts for gain offset and/or temperature illustrated in FIGS. 2a and 2b, and is not illustrated in order to minimize confusion in FIG. 2a. The 20 meV shift can be considered similar to the reduction in peak transition energy due to a 40° C. increase in temperature. The curve translates downward by 20 meV.

Figure 11:
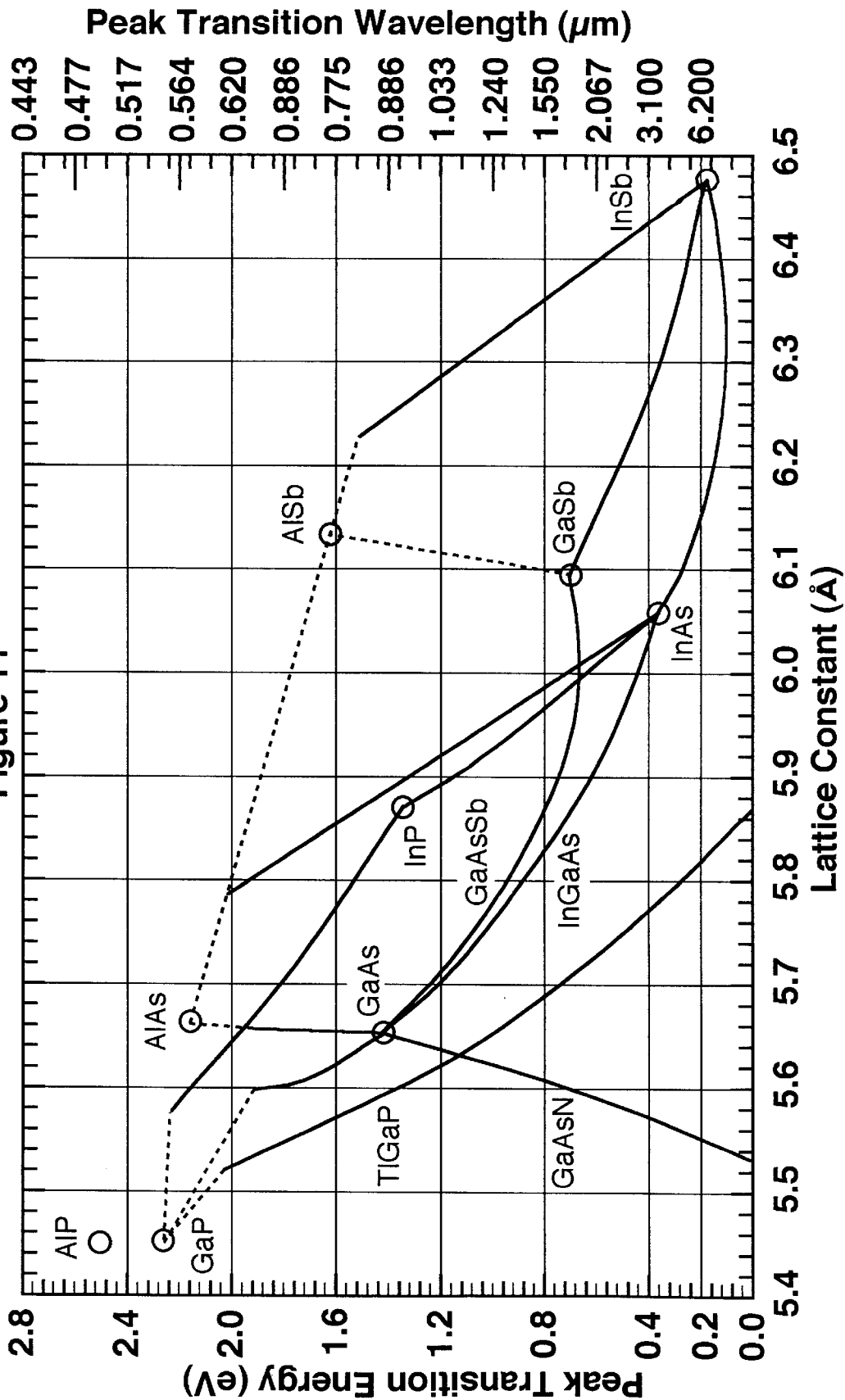
FIG. 11 is a graph of peak transition energy and peak transition wavelength v. lattice constant for a variety of binary and ternary group III–V semiconductor compounds.

Turning now to FIG. 11, there is shown a graph of peak transition energy and peak transition wavelength v. lattice constant for a variety of binary and ternary group III–V semiconductor compounds. The binary compounds are represented by open circles centered on the appropriate coordinates. Ternary compounds are illustrated by by lines between the respective binaries. For example, the line between GaAs and In AS represents the ternary compound (alloy) InGaAs. Solid lines indicate direct bandgap materials; dashed lines are for indirect bandgap materials. The transition energies and wavelengths are for the various compounds in the bulk and unstrained condition. The peak transition energies of strained quantum wells must additionally account for the effects of strain and quantum confinement. This graph is similar to may that are presented in the semiconductor art. Among the various presentations of this data, some discrepancies exist in the finer details. However, the general behavior of the data is comparable in mot presentations. The purpose here is to illustrate general properties of materials rather than to use FIG. 11 as a means for precise determination.

FIG. 11 shows two significant similarities between the ternary alloys InGaAs and GaAsSb (lines from GaAs to InAs and From GaAs to GaAs). These similarities are:

(1) the lines run nearly parallel in the regions close to GaAs on the graph, indicating that similar increases in lattice constant by adding In or Sb to nominal GaAs produce similar decreases in peak transition energy; and (2) InAs and GaSb have nearly the same lattice constant, indicating that incorporating equal concentrations of In or Sb into normal GaAs produce nearly the same lattice mismatch or strain.

The result of these similarities means that from a materials standpoint, In and Sb may be "interchanged" nearly equally. For example, the alloys $In_{0.5}Ga_{0.5}As$ and $In_{0.4}Ga_{0.6}As_{0.9}Sb_{0.1}$ are expected to be roughly equivalent in terms of lattice constant and in peak transition energy. Since the InGaAs line lies below the GaAsSb line, InGaAs has a lower peak transition energy than does GaAsSb having the same lattice constant. Therefore, from a strain-bandgap viewpoint, InGaAs is slightly preferred over GaAsSb for long-wavelength emission on GaAs substrates. InGaAs is also preferred due to more chemical characteristics. Despite the preference for InGaAs, the present invention includes the use of Sb-containing compounds. In the context of this application, statements regarding $In_yGa_{1-y}As$ where y is $\geq 0.5$ are meant to include $In_yGa_{1-y}As_{1-w}Sb_w$ with (y+w) $\geq 0.5$.

The binary compound TlP has a negative peak transition energy or bandgap. Thus, TlP is classified as a metal. The ternary alloy TlGaP is included in FIG. 11 using data from the publication by Asahi et al. It follows the general trend that heavier atomic constituents produce larger lattice constants and lower bandgap energies, or lower peak transition energies. The ternary compound GaAsN is also illustrated in FIG. 11 and appears anomalous. Although GaN has a very small lattice constant, ~4.5 Å, and a very high bandgap energy, greater than 3 eV, the ternary GaAsN has an extremely large "bowing parameter" as described by Kondow et al. Thus, GaAsN may exhibit very low bandgap energies and is even metallic for a large range of concentrations.

Combination of Techniques

Several techniques have been described to extend the emission wavelength of devices grown on a given substrate. Use with the identified ranges of In and Sb concentrations allows 1.3 μm or longer emission wavelengths on GaAs substrates. While the preferred substrate is GaAs, the invention contemplates use for any other substrates, for example, InP, GaP, InAs, GaSb or InSb. A summary of the techniques and their effects are provided below. It should be appreciated that this summary is merely exemplary and the inventive concept should not be viewed as merely limited to the examples provided below:

1) use of superlattice active layers or quantum wells to decrease peak transition energy by about 40 meV and allow pseudomorphic thickness increase by a factor of about 1.25;

2) use of small amounts of nitrogen in the active layers to decrease peak transition energy by about 185 meV for each percent of nitrogen in the group V portion of the active layer;

3) use of strain compensation to allow pseudomorphic thickness increase by a factor of about 2.45;

4) use of nominal (111) oriented substrates to allow pseudomorphic thickness increase by a factor of about 2.0;

5) use of elevated temperature to decrease peak transition energy by about 50 meV per 100 K increase in temperature of the active region; and 6) Use of gain offset to allow emission energy to be lower than the peak transition energy, typically by 25 meV and up to 50 meV or more. It is to be appreciated that all of these techniques are mutually compatible, i.e., use of any technique does not significantly diminish the effectiveness of any other technique. Thus, any or all techniques may be used in combination or alone.

Devices

Figure 8:
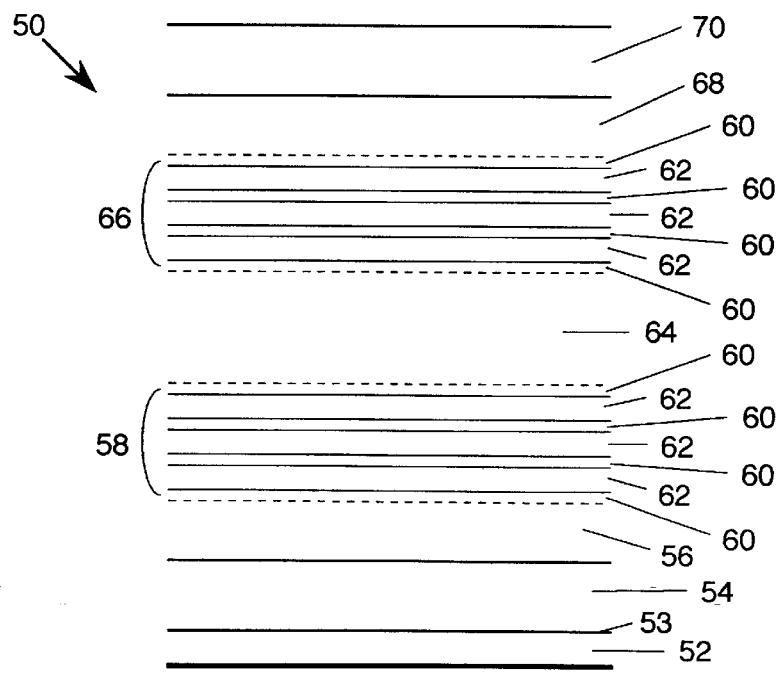
FIG. 8 is a cross section of an active region which incorporates the teachings of (1) the inclusion of superlattice structures, (2) utilizing nitrogen (N) in the strained quantum well, and (3) utilizing strain compensation in pseudomorphic InGaAs/GaAs heterostructures.

Turning now to FIG. 8, a device incorporating the teachings of the invention will be discussed. Semiconductor structure 50 illustrates the use of superlattice layers which may be strain compensated as well as may contain nitrogen. Device 50 is grown on a GaAs substrate 52. It should be appreciated that the substrate may also be InP as discussed below, but for the purposes of this discussion, the substrate shall be GaAs. Next, a confining layer 54 is grown on substrate 52 by an epitaxial process such as MBE, MOCVD or MOMBE at a temperature of 650° C. for a period of 0.1 hours. This results in confining layer 54 having a thickness of 1,000 Å. A standard growth rate of 1 μm/hr is utilized for the growth of materials in this disclosure, unless otherwise stated. It should be appreciated that the thickness of confining layer 54 may vary but should be between 6 Å and 50,000 Å. Next, a tensile strained layer 56 may be grown by an epitaxial process such as MBE, MOCVD or MOMBE at a temperature of 500° C. for a period of 0.3 minutes. This results in tensile strained layer 56 having a thickness of 50 Å. It should be appreciated that the thickness of tensile strained layer may be between 3 Å and 2,000 Å. Thus, it should be appreciated that if the technique of strain compensation is utilized, the tensile strained layer 56 will be present. Otherwise, tensile strained layer 56 may not be present. When present, tensile strained layer 56 preferably comprises $GaAs_{1-z}P_z$ with $0 \leq z \leq 1.0$, if substrate 52 comprises GaAs, or $In_yGa_{1-y}As$ with $0.53 \leq y \leq 1.0$ if substrate 52 comprises InP. Next, a superlattice quantum well 58 is grown. It should be appreciated that the particular growth conditions for the superlattice quantum well 58 will vary with the exact structure of the quantum well 58.

For providing a general understanding of the application of the inventive concept, we will now describe the construction of a strain compensated superlattice having nitrogen containing layers. It should be appreciated that this description is merely illustrative and should in no way be viewed as limiting the invention to this particular structure. First, a GaAs(N) layer 60 is grown above tensile strained layer 56 by an epitaxial process such as MBE, MOCVD or MOMBE at a temperature of 500° C. for a period of 1 second. This results in GaAs(N) layer 60 having a thickness of 3 Å, i.e., one monolayer for this example. It should be appreciated that there may be other materials disposed between layers 56 and 60. For a detailed discussion of this composition of layer 60, please refer to the Nitrogen Containing Layers section, above. Next, a InAs(N) layer 62 by an epitaxial process such as MBE, MOCVD or MOMBE at a temperature of 500° C. for a period of two seconds. This results in InAs(N) layer 62 having a thickness of ~6 Å, i.e., two monolayers in this example. Thus, one period of the superlattice structure 58 is formed. This process is repeated. FIG. 8 illustrates three periods which terminated in a GaAs(N) layer 60. This is merely illustrative of one superlattice structure which closely resembles the superlattice illustrated in FIG. 4a. For other superlattice structures, please refer to FIGS. 4a through 4d. It is to be appreciated that the possible inclusion of nitrogen in GaAs(N) layers 60 may not perform a critical function. Rather, it may simplify the process to keep the nitrogen flowing throughout the growth of superlattice quantum well 58 due to the extreme thinness of layers 60 and 62.

A tensile strained layer 64 may be grown by an epitaxial process such as MBE, MOCVD or MOMBE at a temperature of 500° C. for a period of ~0.6 minutes. This results in tensile strained layer 64 having a thickness of 100 Å. It should be appreciated that the thickness of tensile strained layer may be between 6 Å and 2,000 Å. Thus, it should be appreciated that if the technique of strain compensation is utilized, tensile strain in layer 64 will be present. Otherwise, tensile strain in layer 64 may not be present. Layers 56 and 64 may be of the same material or may be constructed of different semiconductor material or they may have the same basic composition but be of opposite conductivity types. When present, tensile strained layer 64 preferably comprises $GaAs_{1-z}P_z$ with $0 \leq z \leq 1.0$, if substrate 52 comprises GaAs, or $In_yGa_{1-y}As$ with $0.53 \leq y \leq 1.0$ if substrate 52 comprises InP.

In this example, a multiple quantum well structure is illustrated as may be seen from second quantum well 66. It should be appreciated that quantum well 66 need not be present and that a functional device contemplated by the invention may have only one quantum well. The advantage of having multiple quantum wells is that for a given electron-hole density, the optical gain is increased. For convenience, quantum well 66 is constructed in a similar manner as quantum well 58. It should be appreciated that it is contemplated by the invention that quantum well 66 may be different than quantum well 58.

Next, a tensile strained layer 68 may be grown by an epitaxial process such as MBE, MOCVD or MOMBE at a temperature of 500° C. for a period of ~0.3 minutes. This results in tensile strained layer 68 having a thickness of 50 Å. It should be appreciated that the thickness of tensile strained layer may be between 3 Å and 2,000 Å. It should be appreciated that if the technique of strain compensation is utilized, the presence of tensile strained layer 68 is preferred. Alternatively, tensile strained layer 68 may not be present. Layers 56, 64 and 68 may be of the same material or may be constructed of different semiconductor material or they may have the same basic composition but be of alternating conductivity types. When present, tensile strained layers 56, 64, and/or 68 preferably comprise $GaAs_{1-z}P_z$ with $0 \leq z \leq 1.0$, if substrate 52 comprises GaAs, or $In_yGa_{1-y}As$ with $0.53 \leq y \leq 1.0$ if substrate 52 comprises InP.

Finally, a confining layer 70 is grown by an epitaxial process such as MBE, MOCVD or MOMBE on tensile strained layer 68 at a temperature of 650° C. for a period of 0.1 hours. This results in confining layer 70 having a thickness of 1,000 Å. It should be appreciated that the thickness of confining layer 70 may vary but should be between 6 Å and 50,000 Å. Layers 54 and 70 may be of the same material or may be constructed of different semiconductor material or they may have the same basic composition but be of opposite conductivity types.

As stated above, FIG. 8 is provided for a general understanding of the application of the inventive concept. For a discussion of other superlattice structures, strain compensation issues, and the use of nitrogen, please refer to the respective sections, above. It is to be appreciated that the structure illustrated in FIG. 8 may be incorporated into a more complex device structure and that the device may incorporate gain offset and/or elevated operating temperature in addition to any or all the measures illustrated in FIG. 8. Furthermore, in addition to any or all the above, growth of surface 53 of substrate 52 may have any orientation, for example, (001), 4° off the (001) orientation, (011), (111), 2° off the (111) orientation, (311), or any other orientation.

Turning now to FIG. 9a, a cross section of a VCSEL which incorporates the quantum wells of FIGS. 1, 2a, 7 and/or 8 is illustrated. For clarity, like elements have been provided with like reference numeral except that a prime has been added to each reference numeral where there is a slight difference in the particular element in this embodiment. The following discussion will focus on the differences between the elements of this embodiment and that of the preferred embodiment.

Light emitting device 100 which is preferably a vertical cavity surface emitting laser (VCSEL), but it may also be a resonant-cavity light emitting diode (RCLED). Device 100 may be grown on substrate 52'. Bottom mirror 102 comprises high-index layers 104 and low-index layers 106. On bottom mirror 102 is grown bottom spacer 108, active region 110, top spacer 112, and a layer forming a lens and/or aperture 114. For details on specific lenses and/or apertures and their formation, please refer to is U.S. Pat. No. 5,719,891, entitled "Conductive Element with Lateral Oxidation Barrier," filed Dec. 18, 1995; U.S. Pat. No. 5,729,566, entitled "Light Emitting Device Having an Electrical Contact Through a Layer containing Oxidized Material," filed Jun. 7, 1996; U.S. application Ser. No. 08/686,489 entitled "Lens Comprising at Least One Oxidized Layer and Method for Forming Same," filed Jul. 25, 1996; and U.S. Pat. No.

5,724,374 entitled "Aperture comprising an Oxidized Region and a Semiconductor Material," filed Aug. 19, 1996. These applications are hereby incorporated by reference.

Lens and/or aperture 114 has outer segments 115 which do not conduct current and may be oxidized and an inner channel which conducts current and may be non-oxidized. On top of lens and/or aperture 114 may be a top mirror 116 comprising low-index layers 118 and high-index layers 120. Bottom mirror 102 may preferably comprise alternating semiconductor layers such as GaAs or AlGaAs for layers 104 and AlAs or AlGaAs for layers 106. If substrate 52' comprises InP, bottom mirror 102 may preferably comprise alternating semiconductor and oxidized layers, such as InGaAs or InP for layers 104 and an oxide for layers 106. Top mirror 116 may comprise similar materials as bottom mirror 102, or may alternatively comprise dielectric materials. Finally, top and bottom electrical contacts 122, 124 are disposed on respective surfaces of top mirror 116 and substrate 52'. As illustrated, top mirror 116 should be conductive to electrical current. Alternatively, top mirror 116 may be non-conductive, in which case electrical contact 122 should be disposed below top mirror 116. Additionally, optional isolation regions 125 are provided which may be formed by ion implantation. Regions 125 are provided for electrical isolation between VCSELs. In operation of light emitting device 100, a light beam 127 emits preferably out through top mirror 116. Alternatively, light beam 127 may emit through substrate 52'.

Turning now to FIG. 9b, an exploded view of active region 110 is illustrated. This particular quantum well structure illustrates; multiple quantum wells. It should be appreciated that active region 110 may have only one quantum well. The advantage of having multiple quantum wells is that for a given electron-hole density, the optical gain is increased. For convenience, quantum well 126 is constructed in a similar manner as quantum well 128. It should be appreciated that within invention, quantum well 126 may be different than quantum well 128. Barriers or confining layers 54' and 70' are disposed on either side of quantum well 126, 128. It should be appreciated that the quantum wells 126, 128 are constructed as described by the numerous techniques or combinations thereof. For example, quantum wells 126, 128 may resemble quantum wells 58, 66 or may not incorporate all of the techniques illustrated in FIG. 8. It should be appreciated that these techniques are utilized in combination with high In concentrations to reduce the peak transition energy of a device, having a GaAs substrate, to allow for an emission wavelength of 1.3 μm. Thus, the quantum wells 126, 128 may be: (1) superlattice structures as discussed in the above superlattice section; (2) may be strain compensated as discussed above; (3) may incorporate nitrogen in the active layer as discussed above; (4) may be provided with a particular orientation as determined by the orientation of substrate 52' as also discussed above; and/or (5) operated at an elevated or reduced temperature as also discussed above. Furthermore, light emitting device 100 may utilize gain offset as discussed above. For brevity, individual combinations are not discussed. But, it should be appreciated that this application contemplates any combination which increases the emission wavelength to 1.3 μm or above for a GaAs substrate.

It should be appreciated that merely one example of a VCSEL structure has been described. This description is merely illustrative and should in no way be viewed as limiting the invention to this particular structure. For a description of other VCSEL structures which are contemplated by the invention, please refer to FIGS. 5a through 5f of U.S. Pat. No. 5,719,891 by Jewell. This application further includes other VCSEL structures including but not limited to ion implanted VCSELs and other forms of VCSELs having oxide-defined apertures which may be used in conjunction with the inventive teachings of this application and is hereby incorporated by reference.

Turning now to FIG. 10a, a cross section of an edge emitting laser or a light emitting diode, also termed in-plane laser or light-emitting diode, which incorporates the quantum wells of FIGS. 1, 2a, 7 and/or 8 is illustrated. A light source 100' which incorporates elements such as substrate 52', first cladding layer 130, active region 110', second cladding layer 132, top contact 122' and bottom contact 124'. In response to a current flow, light source 100' emits a beam of light, for example light beam 134 as in an edge-emitting laser. Additionally, a current blocking layer 136 may be present which may comprise a partially oxidized layer. Layer 136 has outer segments 138 which do not conduct current and may be oxidized and an inner channel 140 which conducts current and may be non-oxidized. For a detailed discussion on layer 136, the reader is referred to U.S. Pat. No. 5,719,891 by Jewell. Optionally, grating lines 142 may extend partially or completely across light source 100' to form grating 144. Such gratings on an in-plane laser may form a distributed feedback laser (DFB) laser or a distributed Bragg reflector (DBR) laser. A further option is phase shift region 146 in which grating lines 142 are shifted, typically by one quarter wave, to form a phase shifted DFB laser.

Turning now to FIG. 10b, an exploded view of active region 110' is illustrated. As may be seen, this particular quantum well structure illustrates multiple quantum wells. It should be appreciated that active region 110' may have only one quantum well. The advantage of having multiple quantum wells is that for a given electron-hole density, the optical gain is increased. For convenience, quantum well 126' is constructed in a similar manner as quantum well 128'. It should be appreciated that within the invention, quantum well 126' may be different than quantum well 128'. Barriers or confining layers 54' and 70' are disposed on either side of quantum well 126', 128'. It should be appreciated that the quantum wells 126', 128' are conducted as described by the numerous techniques or combinations thereof. For example, quantum wells 126', 128' may resemble quantum wells 58, 66 or may not incorporate all of the techniques illustrated in FIG. 8. It should be appreciated that these techniques are utilized in combination with high In concentrations to reduce the peak transition energy of a device, having a GaAs substrate, to allow for an emission wavelength of 1.3 μm. Thus, the quantum wells 126', 128' may be: (1) superlattice structures as discussed in the above superlattice section; (2) may be strain compensated as discussed above; (3) may incorporate nitrogen in the active layer as discussed above; (4) may be provided with a particular orientation as determined by the orientation of substrate 52' as also discussed above; and/or (5) operated at an elevated or reduced temperature as also discussed above. Furthermore, certain forms of light emitting device 100 may utilize gain offset as discussed above. For brevity, individual combinations are not discussed. But, it should be appreciated that this application contemplates any combination which increases the emission wavelength to 1.3 μm or above for a GaAs substrate.

It should be appreciated that merely one example of an in-plane laser structure has been described. This description is merely illustrative and should in no way be viewed as limiting the invention to this particular structure. Other such in-plane lasers include but are not limited to distributed feedback (DFB) lasers, phase-shifted DFB lasers, distributed Bragg reflector (DBR) lasers, angle-facet surface emitting lasers and grating surface emitting lasers.

Transition Energy/Wavelength for Strained InAs Quantum Wells on InP Substrates and Extension Thereof Using the Inventive Techniques The room temperature (300 K) peak transition energy vs. quantum well thickness is given in FIG. 7 for InAs quantum wells grown on InP substrates and clad by lattice-matched InGaAs barriers. The upper curve represents the nominal peak transition energy, which accounts for bulk bandgap energy, strain effects and quantum confinement energy. Solid dots are the actual data points calculated. The data is in reasonably close agreement with experimental data published by Ploog, et al. The open circles on the curve are at the thickness CT (as calculated from equation 2) and at multiples 0.75, 1.5, and 2.0 of the MBCT. To ease interpretation, various relevant wavelengths are indicated by dashed lines and are labeled on the right axis. The CT for InAs on InP (with overlayer) is 48.5 Å. The dashed line labeled 1.0×CT corresponds to this thickness, and the open circles within it is at a transition energy corresponding to an emission wavelength of 2.3 $\mu$m. Within published state-of-the-art structures, this represents the maximum practical emission wavelength for an InAs quantum well grown on InP. The other curves shown in FIG. 7 will be discussed in context of the wavelength-extending approaches described by the invention. It should be appreciate that the CT discussed with regard to FIG. 7 is determined by equation 2.

Gain Offset

Detuning the cavity resonance (determined by mirror and spacer layer thicknesses) to energies 25 meV lower than the quantum well transition energy is routinely used which allows a 25 meV reduction in emission wavelength. This discussion assumes that 25 meV gain offset remains valid for the long-wavelength devices proposed. The assumption is reasonable but could represent an underestimate or an over estimate. Thus a VCSEL which emits at 2.7 $\mu$m (0.459 eV) would favorably use a quantum well with a peak transition energy of about 0.484 eV, which corresponds to a peak transition wavelength of 2.56 $\mu$m. Conversely, an active material with a peak transition wavelength of 2.56 $\mu$m should be about optimum for a 2.7 $\mu$m-emitting VCSEL. This technique is mainly applicable to VCSELs but is also applicable to some forms of in-plane devices as discussed above. The second highest (solid) curve in FIG. 7 is located 25 meV below the nominal curve and it represents the VCSEL emission wavelengths attainable with the conventional InAs quantum wells. Using 25 meV gain offset alone, the maximum VCSEL emission is calculated to be about 2.43 $\mu$m.

InAsSb Quantum Wells

Calculations indicate that the transition energy may be further decreased by replacing some of the As with Sb to for InAsSb quantum wells. This produces a larger strain and thinner MBCT. InAs has a lattice mismatch of 3.3% from InP. Increasing the mismatch to 4.6% should decrease the transition energy by at least 100 meV in an InAsSb quantum well with about 20% Sb. A curve (third highest curve) is illustrated in FIG. 7 at a level 100 meV below the nominal curve. Unfortunately, the CT is calculated to be 29 Å for such a quantum well. Its position on the curve is indicated by the large open circle. The emission is still well above the 2.7$\mu$ line. However, with a 25 meV gain offset (lowest curve in FIG. 1), the attainable VCSEL emission is very nearly 2.7 $\mu$m. Increasing the strain much further will greatly decrease the MBCT and the quantum confinement energy will increase greatly, thereby producing an overall increase in the transition energy.

InAsN Quantum Wells

For GaAsN, a concentration of only 1% N decreases the bandgap energy by 185 meV. Thus it is entirely reasonable to expect a N concentration of <0.6% to produce a 100 meV drop in energy, resulting in the third highest curve of FIG. 7. In this case however, the addition of N increases the critical thinknessess. Different substrate orientations may further increase the thickness to which pseudomorphic structures may be grown on InP.

Strain-Compensation

To see the effectiveness of this strain compensation on InP substrates, again refer to FIG. 7 with attention to the open circles on the various lines. Now rather than being limited to the thickness at 1.0 times the CT quantum well, thicknesses up to about twice the CT or even more may be considered. The attainable emission wavelength is now nearly 2.7 $\mu$m on the nominal curve (top curve in FIG. 7). With the gain offset of 25 meV (second highest curve in FIG. 1), 2.7 $\mu$m emission is reached at slightly over 1.5 times the CT. When combined with other techniques such as the addition of N, emission wavelengths well over 3 $\mu$m may be attainable and 2.7 $\mu$m emission may be achieved "comfortably."

It should be appreciated that although surface emitting lasers (SELs) such as VCSELs have been discussed above as the preferred structure for a light emitting device which utilizes the teachings of this invention, other structures such as LEDs, or EELs may also benefit from the teachings herein. The basis for selecting VCSELs is that they have excellent operating characteristics and gain offset may reduce emission energies by 25 meV or more. Nevertheless, the inventive teaching is properly regarded as facilitating epitaxial growth of mismatched materials and is applicable to LEDs, RCLEDs, SELs, EELs, and more generally to epitaxial light emitting devices for increasing peak transition wavelength therein.

While we have focused the discussion of the variation of In concentration, it should be appreciated that other group III semiconductor materials may be utilized. For example, the In concentration may be reduced if sufficient Sb is introduced. Nominally, each percent of Sb is almost as effective as In at reducing peak transition energy and it increases the lattice constant by about the same amount. The inclusion of small amounts of Al or P in concentrations of less than 15% is also contemplated by the invention. The inclusion of other elements, e.g., other group elements such as I, II, III, IV, V, VI, VII, VIII, transition, or rare-earth elements in small quantities of less than 5% is contemplated by the invention. Of course, doping of the semiconductor materials may be used in conjunction with the teachings of this invention without departing from the scope of the claims.

Although the present invention has been fully described in conjunction with the preferred embodiment thereof with reference to the accompanying drawings, it is to be understood that various changes and modifications may be apparent to those skilled in the art. Such changes and modifications are to be understood as included within the scope of the present invention as defined by the appended claims, unless they depart therefrom.

What is claimed:

1. A light emitting device having at least a substrate and an active region, said light emitting device comprising:

said substrate having a substrate lattice constant between 5.63 Å and 5.67 Å;

a first strained layer having a lattice constant smaller than said substrate lattice constant and being disposed between said substrate and said active region;

said active region comprising one pseudomorphic light emitting active layer disposed above said substrate, said active layer comprising In, Ga and As, said active layer comprises at least two strained layers, and a third layer disposed between said two strained layers, said active layer having a thickness equal to or less than 80 Å; and wherein said light emitting device has an emission wavelength of at least 1.3 μm.

2. The device recited in claim 1, wherein said active layer has a concentration of In and Sb of 25% or greater of a semiconductor material in said active layer.

3. The device recited in claim 1, wherein said active layer has a thickness less than 2.5 times CT, where: CT=(0.4374/f), where f is an average lattice mismatch of said active layer normalized to a lattice constant of 5.65 Å.

4. The device recited in claim 1, wherein said substrate comprises GaAs.

5. The device recited in claim 1, wherein said substrate consists essentially of GaAs.

6. A light emitting device having at least a substrate and an active region, said light emitting device comprising:

said substrate having a substrate lattice constant between 5.63 Å and 5.67 Å;

a first strained layer having a lattice constant smaller than a substrate lattice constant and being disposed between said substrate and said active region;

said active region comprising at least one pseudomorphic light emitting active layer disposed above said first strained layer, said active layer comprising In, Ga and As; said active layer having a combined concentration of In and Sb of 25% or greater of a semiconductor material in said active layer, said active layer having a thickness greater than CT for a given material, where:

$$CT=(0.4374/f)(\ln(CT/4)+1),$$

where f is an average lattice mismatch of said active layer normalized to a lattice constant of 5.65 Å;

wherein said light emitting device has an emission wavelength of at least 1.3 μm.

7. The device recited in claim 6, wherein said first strained layer has at least one graded interface.

8. The device recited in claim 6, wherein said first strained layer has at least one stepped interface.

9. The device recited in claim 6, wherein said first strained layer has at least one superlattice interface.

10. The device recited in claim 6, wherein said first strained layer has at least one smoothly graded interface.

11. The device recited in claim 6, wherein said first strained layer comprises $GaAs_{1-z}P_z$ with $0.01 \leq z \leq 1.0$.

12. The device recited in claim 6, further comprising a second strained layer disposed above said active region.

13. The device recited in claim 12, wherein said second strained layer comprises $GaAs_{1-z}P_z$ with $0.01 \leq z \leq 1.0$.

14. The device recited in claim 6, wherein said substrate has an orientation between 0° and 5° off the (001) orientation.

15. The device recited in claim 6, further comprising:

a first conductive layer having a first conductivity type, said first conductive layer being disposed below said active layer and in electrical communication therewith;

a second conductive layer having a second conductivity type, said second conductive layer being disposed above said active layer and in electrical communication therewith; and electrical communication means for providing electrical current to said active layer.

16. The device recited in claim 15, further comprising a bottom mirror disposed below said radiation-emitting layer and a top mirror disposed above said radiation-emitting layer, said top and bottom mirrors defining an optical cavity having a cavity resonance at a resonance wavelength corresponding to a resonance energy; said resonance wavelength in μm, as measured in vacuum, being equal to 1.24 divided by said resonance energy, in electron volts.

17. The device recited in claim 16, wherein said bottom mirror comprises alternating high-index layers and low-index layers.

18. The device recited in claim 17, wherein said low index layers comprise oxidized material.

19. The device recited in claim 16, wherein said top mirror, comprises alternating low index layers and high index layers.

20. The device recited in claim 19, wherein said low index layers are selected from the group consisting of: oxidized material, low-index dielectric material, relatively-low-index semiconductor material, and any combination thereof.

21. The device recited in claim 20, wherein said high index layers are selected from the group consisting of: high-index dielectric material, high-index semiconductor material and any combination thereof.

22. The device recited in claim 16, further comprising an aperture disposed between said active region and said top mirror, said aperture having a first and second region, said first region exhibits high electrical resistance; and second region and has an electrical resistance lower that said first region.

23. The device recited in claim 22, wherein said first region is oxidized and said second region is oxidized less than said first region.

24. The device recited in claim 16, wherein said resonance wavelength exceeds a peak transition wavelength of said active region by at least 0.010 μm.

25. The device recited in claim 15, further comprising a grating layer disposed above said second conductive layer, said grating layer having grating lines extending at least partially or completely across said active region to form a grating, said grating defining an optical cavity having a cavity resonance at a resonance wavelength corresponding to a resonance energy; said resonance wavelength in μm, as measured in vacuum, being equal to 1.24 divided by said resonance energy, in electron volts.

26. The device recited in claim 25, wherein said grating lines are shifted by approximately least one quarter wave or a multiple thereof to form a phase shift grating.

27. The device recited in claim 6, wherein said active region has a peak transition wavelength of at least 1.24 μm.

28. A light emitting device having at least a substrate and an active region, said light emitting device comprising:

said substrate having a substrate lattice constant between 5.63 Å and 5.67 Å;

a first strained layer disposed between said substrate and said active region, said first strained layer having a first accumulated strain and a first critical accumulated strain associated therewith, said first accumulated strain being less than said first critical accumulated strain;

said active region comprising at least one pseudomorphic light emitting active layer disposed above said substrate, said active layer comprising In, Ga and As; said active layer having a concentration of In and Sb greater than 25% of a semiconductor material in said active layer, said active layer having a second accumulated strain and a second critical accumulated strain associated therewith, the algebraic sum of said first and second accumulated strains being less than said second critical accumulated strain;

wherein an algebraic sum said first and second critical accumulated strains for a given material equals a strain of said material multiplied by CT for a given material, where:

$$CT=(0.4374/f)[\ln(CT/4)+1],$$

where f is an average lattice mismatch of said active layer normalized to a lattice constant of 5.65 Å;

wherein said light emitting device has an emission wavelength of at least 1.3 $\mu$m.

29. The device recited in claim 28, further comprising:
a first conductive layer having a first conductivity type, said first conductive layer disposed below said active layer and in electrical communication with said active layer;
a second conductive layer having a second conductivity type, said second conductive layer being disposed above said active layer and in electrical communication therewith; and
electrical communication means for providing electrical current to said active layer.

30. The device recited in claim 29, further comprising a bottom mirror disposed below said radiation-emitting layer and a top mirror disposed above said radiation-emitting layer, said top and bottom mirrors defining an optical cavity having a cavity resonance at a resonance wavelength corresponding to a resonance energy; said resonance wavelength in $\mu$m, as measured in vacuum, being equal to 1.24 divided by said resonance energy, in electron volts.

31. The device recited in claim 30, wherein said top mirror, comprises alternating low index layers and high index layers.

32. The device recited in claim 31, wherein said low index layers are selected from the group consisting of: oxidized material, low-index dielectric material, relatively-low-index semiconductor material, and any combination thereof.

33. The device recited in claim 32, wherein said high index layers are selected from the group consisting of: high-index dielectric material, high-index semiconductor material and any combination thereof.

34. The device recited in claim 30, further comprising an aperture disposed between said active region and said top mirror, said aperture having a first and second region.

35. The device recited in claim 34, wherein said first region exhibits high electrical resistance; and second region and has an electrical resistance lower that said first region.

36. The device recited in claim 34, wherein said first region is oxidized and said second region is oxidized less than said first region.

37. The device recited in claim 30, wherein said active region has a peak transition wavelength of at least 1.24 $\mu$m and said resonance wavelength exceeds a peak transition wavelength of said active region by at least 0.010 $\mu$m.

38. The device recited in claim 30, wherein said bottom mirror comprises alternating high-index layers and low-index layers.

39. The device recited in claim 38, wherein said low index layers comprise oxidized material.

40. The device recited in claim 29, further comprising a grating layer disposed above said second conductive layer, said grating layer having grating lines extending at least partially or completely across said active region to form a grating, said grating defining an optical cavity having a cavity resonance at a resonance wavelength corresponding to a resonance energy; said resonance wavelength in $\mu$m, as measured in vacuum, being equal to 1.24 divided by said resonance energy, in electron volts.

41. The device recited in claim 29, wherein said grating lines are shifted by approximately least one quarter wave or a multiple thereof to form a phase shift grating.

42. A light emitting device having at least a substrate and an active region, said light emitting device comprising:
said substrate comprising having a substrate lattice constant between 5.63 Å and 5.67 Å;
a first strained layer disposed between said substrate and said active region, said first strained layer having a first accumulated strain and a first critical accumulated strain associated therewith, said first accumulated strain being less than said first critical accumulated strain;
said active region comprising at least one pseudomorphic light emitting active layer disposed above said substrate, said active layer comprising In and Ga, said active layer comprising at least two strained layers, and a third layer disposed between said two strained layers, said active layer having a second accumulated strain and a second critical accumulated strain associated therewith, the algebraic sum of said first and second accumulated strains being less than said second critical accumulated strain; and
wherein said light emitting device has an emission wavelength of at least 1.3 $\mu$m.

43. The device recited in claim 42, wherein said active layer has a concentration of In and Sb of 25% or greater of a semiconductor material in said active layer.

44. The device recited in claim 42, wherein said active layer has a thickness less than 2.5 times CT, where: $CT=(0.4374/f)[\ln(CT/4)+1]$, where f is an average lattice mismatch of said active layer normalized to a lattice constant of 5.65 Å.

45. The device recited in claim 42, wherein said first strained layer comprises $GaAs_{1-z}P_z$ with $0.1 \leq z \leq 1.0$.

46. The device recited in claim 42, further comprising a second strained layer disposed above said active region.

47. The device recited in claim 46, wherein said second strained layer comprises $GaAs_{1-z}P_z$ with $0.1 \leq z \leq 1.0$.

48. The device recited in claim 42, wherein said substrate comprises GaAs.

49. The device recited in claim 42, wherein said substrate consists essentially of GaAs.

50. The device recited in claim 42, wherein said substrate has an orientation between 0° and 5° off the (001) orientation.

51. The device recited in claim 42, wherein said active layers are integral multiples of atomic monolayers.

52. The device recited in claim 42, wherein at least two adjacent superlattice layers differ in at least one constituent element by at least 15%.

53. The device recited in claim 42, wherein said superlattice comprises $(InAs)_2(GaAs)_1(InAs)_2(GaAs)_1(InAs)_2$, wherein InAs and GaAs comprise at least 90% of the (InAs) and (GaAs) layers, respectively.

54. The device recited in claim 42, further comprising:
a first conductive layer having a first conductivity type, said first conductive layer disposed in electrical communication with said active layer;
a second conductive layer having a second conductivity type, said second conductive layer being disposed above said active layer and in electrical communication therewith; and
electrical communication means for providing electrical current to said active layer.

55. The device recited in claim 54, further comprising a bottom mirror disposed below said radiation-emitting layer and a top mirror disposed above said radiation-emitting layer, said top and bottom mirrors defining an optical cavity having a cavity resonance at a resonance wavelength corresponding to a resonance energy; said resonance wavelength in $\mu$m, as measured in vacuum, being equal to 1.24 divided by said resonance energy, in electron volts.

56. The device recited in claim 55, wherein said active region has a peak transition wavelength of at least 1.24 $\mu$m and said resonance wavelength exceeds a peak transition wavelength of said active region by at least 0.010 $\mu$m.

57. The device recited in claim 54, further comprising a grating layer disposed above said second conductive layer, said grating layer having grating lines extending at least partially or completely across said active region to form a grating, said grating defining an optical cavity having a cavity resonance at a resonance wavelength corresponding to a resonance energy; said resonance wavelength in $\mu$m, as measured in vacuum, being equal to 1.24 divided by said resonance energy, in electron volts.

58. The device recited in claim 57, wherein said grating lines are shifted by approximately least one quarter wave or a multiple thereof to form a phase shift grating.

59. A light emitting device having at least a substrate and an active region, said light emitting device comprising:
said substrate comprising having a substrate lattice constant between 5.63 Å and 5.67 Å;
a first strained layer disposed between said substrate and said active region, said first strained layer having a first accumulated strain and a first critical accumulated strain associated therewith, said first accumulated strain being less than said first critical accumulated strain;
said active region comprising at least one pseudomorphic light emitting active layer disposed above said substrate, said active layer comprising In, Ga and As, said active layer comprises at least two strained layers, and a third layer disposed between said two strained layers, forming a superlattice having an average sum of In and Sb concentrations in said superlattice at 25% or greater of a semiconductor material in said active layer, said active layer having a second accumulated strain and a second critical accumulated strain associated therewith, said second accumulated strain being less than said second critical accumulated strain;
wherein said first and second critical accumulated strain for a given material equals a strain of said material multiplied by CT for a given material, where:

$CT=(0.4374/f)[\ln (CT/4)+1]$, where f is an average lattice mismatch of said active layer normalized to a lattice constant of 5.65 Å; and
wherein said light emitting device has an emission wavelength of at least 1.3 $\mu$m.

60. A light emitting device having at least a substrate and an active region, said light emitting device comprising:
said substrate comprising having a substrate lattice constant between 5.63 Å and 5.67 Å and having a growth plane which has an orientation within 15° of (111);
said active region comprising at least one pseudomorphic light emitting active layer disposed above said substrate, said active layer comprising In, Ga and As, said active layer having a thickness equal to or less than twice a respective CT, where:

$CT=(0.4374/f)[\ln (CT/4)+1]$, where f is an average lattice mismatch of said active layer normalized to a lattice constant of 5.65 Å;
wherein said active layer has an average sum of In and Sb concentrations of equal to or greater than 25% or greater of a semiconductor material in said active layer; and
wherein said light emitting device has an emission wavelength of at least 1.3 $\mu$m.

61. The device recited in claim 60, further comprising:
a first conductive layer having a first conductivity type, said first conductive layer disposed in electrical communication with said active layer;
a second conductive layer having a second conductivity type, said second conductive layer being disposed above said active layer and in electrical communication therewith; and
electrical communication means for providing electrical current to said active layer.

62. The device recited in claim 61, further comprising a bottom mirror disposed below said radiation-emitting layer and a top mirror disposed above said radiation-emitting layer, said top and bottom mirrors defining an optical cavity having a cavity resonance at a resonance wavelength corresponding to a resonance energy; said resonance wavelength in $\mu$m, as measured in vacuum, being equal to 1.24 divided by said resonance energy, in electron volts.

63. The device recited in claim 62, wherein said bottom mirror comprises alternating high-index layers and low-index layers.

64. The device recited in claim 63, wherein said low index layers comprise oxidized material.

65. The device recited in claim 62, wherein said top mirror, comprises alternating low index layers and high index layers.

66. The device recited in claim 65, wherein said low index layers are selected from the group consisting of: oxidized material, low-index dielectric material, relatively-low-index semiconductor material, and any combination thereof.

67. The device recited in claim 66, wherein said high index layers are selected from the group consisting of: high-index dielectric material, high-index semiconductor material and any combination thereof.

68. The device recited in claim 62, further comprising an aperture disposed between said active region and said top mirror, said aperture having a first and second region.

69. The device recited in claim 68, wherein said first region exhibits high electrical resistance; and second region and has an electrical resistance lower that said first region.

70. The device recited in claim 68, wherein said first region is oxidized and said second region is oxidized less than said first region.

71. The device recited in claim 62, wherein said active region has a peak transition wavelength of at least 1.24 μm and said resonance wavelength exceeds a peak transition wavelength of said active region by at least 0.010 μm.

72. The device recited in claim 61, further comprising a grating layer disposed above said second conductive layer, said grating layer having grating lines extending at least partially or completely across said active region to form a grating, said grating defining an optical cavity having a cavity resonance at a resonance wavelength corresponding to a resonance energy; said resonance wavelength in μm, as measured in vacuum, being equal to 1.24 divided by said resonance energy, in electron volts.

73. The device recited in claim 72, wherein said grating lines are shifted by approximately least one quarter wave or a multiple thereof to form a phase shift grating.

* * * * *

UNITED STATES PATENT AND TRADEMARK OFFICE
CERTIFICATE OF CORRECTION

PATENT NO. : 5,825,796
DATED : October 20, 1998
INVENTOR(S) : Jack L. Jewell, et al It is certified that error appears in the above-identified patent and that said Letters Patent is hereby corrected as shown below:

In Column 9, Line 21 and Line 39, occurrences of "aid" should read --the--.

In Column 14, Line 31, the word "is" should read --in--.

In Column 20, Line 19, the symbol "ev" should read --eV--.

In Column 27, Line 23, the occurrence of "1.32 µm" should read --approximately 1.3 µm--.

In Column 29, Line 47, the word "sturdy" should read --study--.

In Column 31, Line 21, the occurrence of "In AS" should read --InAs--.

In Column 31, Line 28, the word "may" should read --many--.

In Column 31, line 31, the word "mot" should read --most--.

Signed and Sealed this

Thirteenth Day of March, 2001

Attest:

NICHOLAS P. GODICI

Attesting Officer      Acting Director of the United States Patent and Trademark Office

UNITED STATES PATENT AND TRADEMARK OFFICE
CERTIFICATE OF CORRECTION

PATENT NO. : 5,825,796
DATED : October 20, 1998
INVENTOR(S) : Jewell, Jack, L. et al.

It is certified that error appears in the above-identified patent and that said Letters Patent is hereby corrected as shown below:

In the Background of the Invention section, after the first paragraph under the Field of Invention Section please add, as a new paragraph, after line 25, the following:
-- This invention is made with government support under contract number DASG60-96-C-0135, awarded by the United States Department of Defense. The government may have certain rights in this invention. --

Signed and Sealed this

Second Day of October, 2001

Attest:

NICHOLAS P. GODICI
Attesting Officer — Acting Director of the United States Patent and Trademark Office